United States Patent
Lewis

(10) Patent No.: US 7,102,253 B2
(45) Date of Patent: Sep. 5, 2006

(54) MOSFET BASED, HIGH VOLTAGE, ELECTRONIC RELAYS FOR AC POWER SWITCHING AND INDUCTIVE LOADS

(76) Inventor: James M. Lewis, 11405 Alabama Hwy. 33, Moulton, AL (US) 35650

( * ) Notice: Subject to any disclaimer, the term of this patent is extended or adjusted under 35 U.S.C. 154(b) by 359 days.

(21) Appl. No.: 10/386,665

(22) Filed: Mar. 13, 2003

(65) Prior Publication Data

US 2004/0075965 A1  Apr. 22, 2004

Related U.S. Application Data

(63) Continuation-in-part of application No. 10/034,925, filed on Dec. 31, 2001, now Pat. No. 6,683,393.

(51) Int. Cl.
H01H 47/00 (2006.01)
H01H 35/00 (2006.01)
H01H 83/00 (2006.01)
H01H 33/59 (2006.01)
H02H 3/20 (2006.01)
H02B 1/24 (2006.01)

(52) U.S. Cl. .................. 307/126; 307/116; 307/130; 307/128; 307/115; 307/132 E

(58) Field of Classification Search ............ 307/112, 307/115, 128, 141.4, 113, 130, 125, 126, 307/123 E, 132 E
See application file for complete search history.

(56) References Cited

U.S. PATENT DOCUMENTS

| | | | |
|---|---|---|---|
| 4,052,623 A | 10/1977 | Loberg | |
| 4,438,356 A | 3/1984 | Fleischer | |
| 4,491,750 A | 1/1985 | Janutka | |
| 4,511,815 A | * 4/1985 | Wood | 327/436 |
| 4,523,251 A | 6/1985 | Erdmann et al. | |

(Continued)

FOREIGN PATENT DOCUMENTS

DE  4429285  12/1995

Primary Examiner—Lynn Feild
Assistant Examiner—Michael Rutland-Wallis
(74) Attorney, Agent, or Firm—Welsh & Flaxman LLC

(57) ABSTRACT

A MOSFET based, high voltage, high current AC electronic relay operating with normally closed contacts is disclosed. The relay includes at least one MOSFET switching circuit selectively switching between switch conducting and switch isolation. The at least one MOSFET switching circuit is normally closed and includes a plurality of inputs controlling the operation thereof. The plurality of inputs are connected to at least one rectifier such that a voltage differential exists between any two inputs of the MOSFET switching circuit providing a voltage source maintaining the MOSFET switching circuit normally closed. The relay also includes a control circuit linked to and controlling operation of the first transformer and second transformer. A switch for use in controlling operation of a MOSFET based, high voltage, high current AC electronic relay is also disclosed. The switch includes a key and a receptacle for selectively receiving the key at various positions. The receptacle includes a plurality of contacts for selective engagement with the key. The contacts includes first and second common contacts connecting to a common terminal, first and second relay block contacts connecting to a relay block, a normally closed contact coupled to a normally closed terminal and a normally open contact coupled to a normally open terminal. In use, the key is selectively positioned within the receptacle for placing the relay in an automatic mode, a normal mode or an energized mode.

17 Claims, 24 Drawing Sheets

U.S. PATENT DOCUMENTS

| | | |
|---|---|---|
| 4,709,233 A | 11/1987 | Duval |
| 4,728,825 A | 3/1988 | Sugayama et al. |
| 4,847,719 A | 7/1989 | Cook et al. |
| 4,888,504 A | 12/1989 | Kinzer |
| 5,003,246 A | 3/1991 | Nadd |
| 5,418,679 A | 5/1995 | Crane et al. |
| 5,481,219 A | 1/1996 | Jacobs et al. |
| 5,763,962 A | 6/1998 | Tsurumi |
| 5,784,742 A * | 7/1998 | Giuliani et al. ............... 15/22.1 |
| 5,812,383 A * | 9/1998 | Majid et al. ............. 363/21.05 |
| 5,894,397 A | 4/1999 | Nelson |
| 5,907,223 A * | 5/1999 | Gu et al. ..................... 315/247 |
| 6,134,125 A * | 10/2000 | Wenzel ....................... 363/37 |
| 6,201,680 B1 * | 3/2001 | Tokatian ..................... 361/119 |
| 6,259,306 B1 | 7/2001 | Brulhart et al. |
| 6,331,794 B1 | 12/2001 | Blanchard |
| 6,339,262 B1 | 1/2002 | Igarashi et al. |
| 6,434,025 B1 * | 8/2002 | Shirai et al. ............... 363/21.1 |
| 6,456,511 B1 * | 9/2002 | Wong ....................... 363/21.13 |
| 6,462,603 B1 * | 10/2002 | Pong et al. ................. 327/365 |
| 6,496,068 B1 | 12/2002 | Eddlemon |
| 6,535,400 B1 * | 3/2003 | Bridge ..................... 363/21.06 |

* cited by examiner

Inductive load with positive power source
and discharge (or flyback) diode

Inductive load with negative DC power source
and discharge (or flyback) diode

AC Polarity Signal Circuit

AC Voltage Sense Waveforms

MOSFET BASED, HIGH VOLTAGE, ELECTRONIC RELAYS FOR AC POWER SWITCHING AND INDUCTIVE LOADS

CROSS REFERENCE TO RELATED APPLICATIONS

This application is a continuation in part of U.S. patent application Ser. No. 10/034,925, filed Dec. 31, 2001 now U.S. Pat. No. 6,683,393, entitled "MOSFET BASED, HIGH VOLTAGE, ELECTRONIC RELAYS FOR AC POWER SWITCHING AND INDUCTIVE LOADS".

BACKGROUND OF THE INVENTION

1. Field of the Invention

The invention relates to electronic relays. More particularly, the invention relates to MOSFET based, high voltage, electronic relays for AC power switching and inductive loads.

2. Description of the Prior Art

Advances in solid-state switching and relay technology have made possible the replacement of many electromechanical switching and relay assemblies. Solid-state devices provide the power control systems in which they are incorporated with long life, quiet operation and other associated advantages.

However, those skilled in the art will appreciate the difficulties associated with the development of electronic relays which may be used for AC power switching. Prior systems have exhibited shortcomings in the manner in which they provide for quick and reliable switching required in the management of AC power sources.

In addition to prior systems failing to provide for adequate switching required in the management of AC power sources, prior relays generally employ normally open contacts as opposed to the implementation of normally closed contacts. The use of normally open contacts results from the ready availability and ease of construction. Prior to the development of the present invention, the implementation of normally closed contacts in a solid state relay would have required the inclusion of additional power inputs; something generally considered undesirable due to the added complexity and cost of the overall relay.

Further to the shortcomings listed above, the prior art also fails to provide a mechanism by which a solid state relay may be controlled by an operator in a manner overriding the automated controls of the relay.

With this in mind, the present invention overcomes the shortcomings of the prior solid state devices by providing a MOSFET based, high voltage, electronic relay for AC power switching and inductive loads. The present invention further provides a MOSFET based, high voltage, electronic relay for AC power switching which incorporates normally closed contacts without the need for the addition of power inputs as well as an override/bypass switch for use in conjunction with the relay such that a operator may selectively control operation of the relay apart from the automated controls of the relay.

SUMMARY OF THE INVENTION

It is an object of the present invention to provide a MOSFET based, high voltage, high current AC electronic relay operating with normally closed contacts. The relay includes at least one MOSFET switching circuit selectively switching between switch conducting and switch isolation. The at least one MOSFET switching circuit is normally closed and includes a plurality of inputs controlling the operation thereof. The plurality of inputs are connected to at least one rectifier such that a voltage differential exists between any two inputs of the MOSFET switching circuit providing a voltage source maintaining the MOSFET switching circuit normally closed. The relay also includes a control circuit linked to and controlling operation of the first transformer and second transformer.

It is also an object of the present invention to provide a relay including a first transformer coupled to the MOSFET switching circuit, the first transformer selectively applying a predetermined first voltage to the MOSFET switching circuit which establishes the MOSFET switching circuit in switch conducting. The relay also includes a second transformer coupled to the MOSFET switching circuit, the second transformer selectively applying a predetermined second voltage to the MOSFET switching circuit which establishes the MOSFET switching circuit in switch isolation in an expedited manner.

It is another object of the present invention to provide a relay wherein the first transformer is associated with at least one rectifier and the second transformer is associated with at least one rectifier.

It is a further object of the present invention to provide a relay including a power supply connected to the first transformer, the second transformer and the control circuit.

It is yet another object of the present invention to provide a relay wherein the MOSFET switching circuit includes first and second MOSFETs electrically connected to the first transformer for selectively establishing switch conducting upon application of a predetermined first voltage by the first transformer.

It is also an object of the present invention to provide a relay wherein the MOSFET switching circuit includes third and fourth MOSFETs electrically connected to the second transformer for selectively establishing switch isolation upon the application of a predetermined second voltage by the second transformer.

It is also another object of the present invention to provide a relay wherein a first rectifier is associated with inputs of the first MOSFET, a second rectifier is associated with inputs of the second MOSFET, a third rectifier is associated with inputs of the third MOSFET and a second rectifier is associated with inputs of the second MOSFET.

It is also an object of the present invention to provide a switch for use in controlling operation of a MOSFET based, high voltage, high current AC electronic relay. The switch includes a key and a receptacle for selectively receiving the key at various positions. The receptacle includes a plurality of contacts for selective engagement with the key. The contacts includes first and second common contacts connecting to a common terminal, first and second relay block contacts connecting to a relay block, a normally closed contact coupled to a normally closed terminal and a normally open contact coupled to a normally open terminal. In use, the key is selectively positioned within the receptacle for placing the relay in an automatic mode, a normal mode or an energized mode.

It is also a further object of the present invention to provide a switch wherein the key shorts the normally closed contact with either of the first and second relay block contacts and the normally open contact with the other of the first and second relay block contacts to place the relay in automatic mode; the key shorts the normally closed contact to the first or second common contact and the first relay block contact to the second relay block contact, leaving the normally open contact open, to place the relay in normal mode; and the key shorts the normally open contact to the first or second common contact and the first relay block contact to the second relay block contact, leaving the normally closed contact open, to place the relay in energized mode.

It is another object of the present invention to provide a switch including a second set of contacts within the receptacle.

It is also an object of the present invention to provide a switch wherein the relay is a normally closed relay.

It is still another object of the present invention to provide a switch wherein the key may be selectively removed from the receptacle to place the relay in safe mode.

Other objects and advantages of the present invention will become apparent from the following detailed description when viewed in conjunction with the accompanying drawings, which set forth certain embodiments of the invention.

DESCRIPTION OF THE PREFERRED EMBODIMENT

Figure 1:
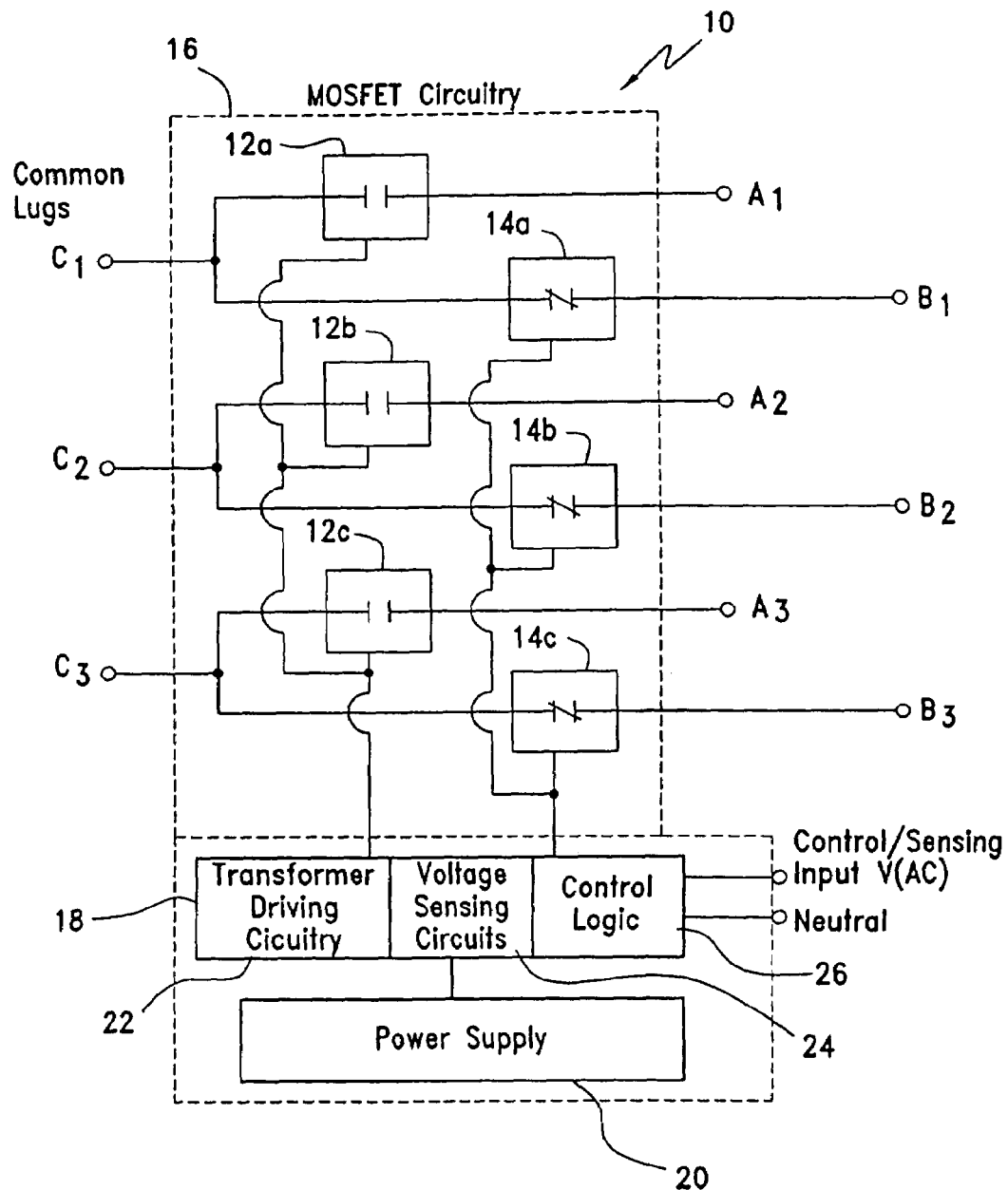
FIG. 1 is a schematic of a triple-pole, double throw system in accordance with the present invention.

The detailed embodiments of the present invention are disclosed herein. It should be understood, however, that the disclosed embodiments are merely exemplary of the invention, which may be embodied in various forms. Therefore, the details disclosed herein are not to be interpreted as limiting, but merely as the basis for the claims and as a basis for teaching one skilled in the art how to make and/or use the invention.

With reference to FIGS. 1 to 18, various embodiments of a MOSFET based, high voltage, high current AC electronic relay are disclosed in accordance with the present invention. In general, the relay includes a MOSFET switching circuit selectively switching between switch conducting (on) and switch isolation (off), a control/sensing circuitry and a power supply. The control/sensing circuitry includes first and second transformers (including transformer driving circuitry) coupled to each MOSFET switching circuit, a control voltage sensing circuit linked to and controlling operation of the first transformer and second transformer and control logic. The first transformer selectively applies a predetermined first voltage to the MOSFET switching circuit which establishes the MOSFET switching circuit in switch conducting. The relay further includes a second transformer coupled to the MOSFET switching circuit. The second transformer selectively applies a predetermined second voltage to the MOSFET switching circuit which establishes the MOSFET switching circuit in switch isolation.

Generally, the present invention provides novel techniques for handling the problems associated with switching AC power through the use of solid state devices. With this in mind, the present relay may be utilized in a number of possible configurations from single-pole, single-throw to multiple-pole, multiple-throw. In accordance with one embodiment of the present invention, and as disclosed in FIG. 1, the present electronic relay is applied in a three-phase relay 10 having both normally open 12a, 12b, 12c and normally closed 14a, 14b, 14c contacts. The disclosed three-phase configuration may also be referred to as a triple-pole, double-throw relay.

In addition to generally handling the problems associated with switching AC power through the use of solid state devices, the present invention also provides for the utilization of normally closed contacts (or switches) without the need for additional power inputs. Normally open contacts are generally easy to construct and readily available for use in conjunction with solid state relays. However, prior systems attempting to incorporate normally closed contact into a solid state relay have been required to provide an additional power input.

As will be described below in the various embodiments of the present invention, a small amount of power is gleaned from the circuit to be controlled. In the case of relays for switching voltages (AC or DC) in accordance with the present invention, one voltage source exists that is to be switched and another voltage source is identified as the "sense voltage". When there is no voltage on the "sense voltage" inputs, the relay is said to be in the normal condition. When a certain voltage is applied to the "sense voltage" inputs, the relay is considered activated.

The power applied to the "sense voltage" inputs is used to power the operation of the relay. This is how most (if not all)

solid state relays operate. The problem arises as to how one may power the normally closed parts of the circuit when no power exists at the sense voltage input. In accordance with a preferred embodiment of the present invention, and as will be discussed below in greater detail, all inputs of the relay, both switched inputs and sense inputs, are connected to rectifiers so that a voltage differential existing between any two input pins becomes a voltage source. The voltage source is used to power the relay and provide power to the normally closed contacts when no power exists at the sense voltage input. This power source also allows the relay to perform monitoring and communication functions regardless of the condition of the sense input.

The present system does not work when there are no voltages connected to any of the input pins of the relay. However, when this occurs, there is nothing to control and there is no need for the normally closed condition. As such, the inability of the relay to operate under these conditions is trivial.

As is described below with reference to the various embodiments disclosed in accordance with the present invention, the present circuit uses various combinations of systems to provide the proper operating voltage for the relay from the rectified voltage. The system typically rectifies the voltage into a high-voltage capacitor and then use either shunt regulation of DC/DC conversion to lower the voltage to the proper operating voltage. If the voltage is too low, a step-up DC/DC power supply must be used. It is also contemplated that synchronous rectification may be used so that high voltages do not have to be dealt with. It is further contemplated that a combination transformer capacitor may be used to convert the waveform directly from the rectifier without using a high voltage capacitor. The power supply is really insignificant, it is the concept of pulling power from the circuits under control that present invention aims to achieve.

With reference to FIG. 1, the basic configuration of a triple-pole, double-throw circuit utilizing the present electronic relay is disclosed. As the schematic illustrates, the electronic relay 10 is divided into three major systems: the MOSFET switching circuitry 16 which conducts and blocks the flow of electricity, the control/sensing circuitry 18 which includes all of the analog and digital electronics permitting the relay to function in a desired manner and the power supply 20 providing DC power to the components making up the present relay 10. As will be discussed below in greater detail, the control/sensing circuitry 18 is made up of transformers and transformer driving circuitry 22 that provides isolated gate to source voltages critical to the operation of the present relay, control voltage sensing circuits 24 and control logic 26 coordinating all activities of the various components of the control/sensing circuitry.

Figure 2:
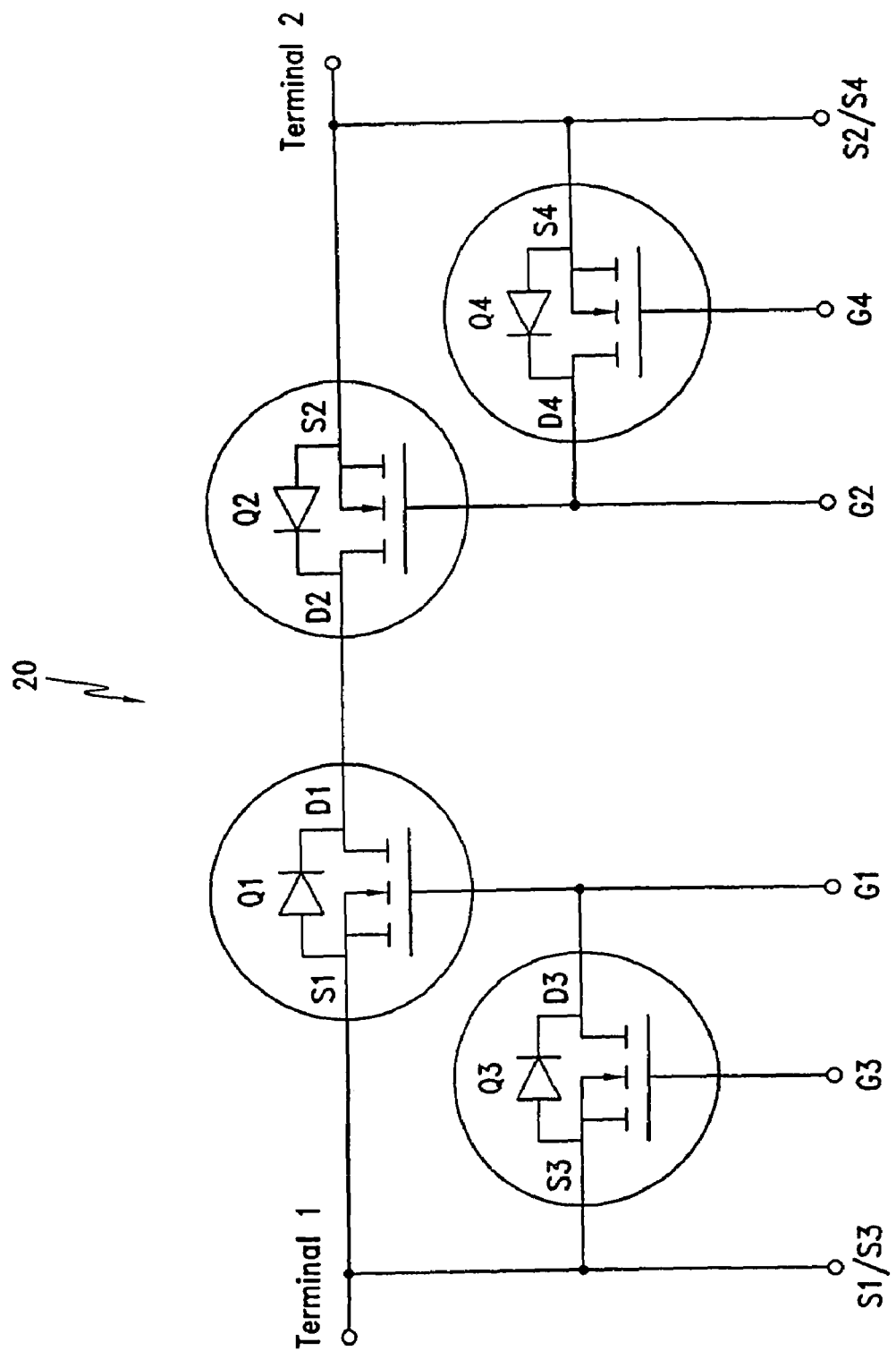
FIG. 2 is a schematic of a basic MOSFET switching circuit.

With reference to FIGS. 1 and 2, the triple-pole, double-throw relay 10 includes MOSFET switching circuitry 16 composed of a plurality of MOSFET switching circuits 28 (i.e, open and closed contacts 12a–c, 14a–c) selectively actuated to control the flow of electricity between opposed terminals. A schematic of the basic MOSFET switching circuit 28 used in accordance with a preferred embodiment of the present invention is disclosed with reference to FIG. 2. The MOSFET switching circuit 28 includes four MOSFETs Q1, Q2, Q3, Q4. The MOSFETs are shown complete with their inherent diodes, gates, sources and drains. MOSFETs Q1 and Q2 are power MOSFETs capable of sustaining large Vds (drain to source voltages) when Vgs (gate to source voltage)=0V and are capable of conducting relatively large amounts of current with extremely low resistance and low Vds when Vgs>Threshold. MOSFETs from a number of manufacturers have been tested for use in accordance with the present invention. In accordance with a preferred embodiment of the present invention, that is, for use in conjunction with a 480V AC relay, 1000V MOSFETs from IXYS are used as they are available with higher current (20A or more) and lower resistance ratings. However, MOSFETs from other manufacturers, for example, On Semiconductor, International Rectifier and Harris, may be used in accordance with the present invention without departing from the spirit thereof.

With regard to MOSFETs Q3 and Q4, they have been selected for speed, low capacitance, low resistance and small size. The Vds of these devices need not be over 20V and the Ids (drain to source current) may be in the mA range. MOSFETs meeting these requirements are currently available from numerous manufacturing sources, including, but not limited to, Vishay and Supertex. While specific suppliers are noted, those skilled in the art will appreciate the variety of different MOSFETs that maybe utilized in accordance with the present invention.

With reference once again to FIG. 2, MOSFETs Q1 and Q2 are connected in a bipolar arrangement. Such a bipolar connection is well known in the art. MOSFETs Q1 and Q2 are drain connected MOSFETs. Drain connected MOSFETs are utilized in accordance with a preferred embodiment of the present invention as they have shown positive results during initial testing. However, it is contemplated that source connected MOSFETs may similarly be utilized without departing from it the spirit of the present invention.

In operation, the MOSFET switching circuit 28 disclosed in accordance with a preferred embodiment of the present invention operates in a switch conducting mode (that is, on) when MOSFETs Q1 and Q2 conduct. MOSFETs Q1 and Q2 conduct when there is a positive voltage applied between G1 and S1/S3 and between G2 and S2/S4. In addition, this switch conducting mode requires that no voltage is respectively applied between G3 and S1/S3 and between G4 and S2/S4. In order to ensure that Q3 and Q4 remain off, a resistor may be connected between the gate and drain of MOSFETs Q3 and Q4 to eliminate any capacitively coupled charges that night build up from the influence of the AC power. It is also contemplated that a depletion mode MOSFET may be used to assist in eliminating unwanted gate voltages on MOSFETs Q3 and Q4.

The MOSFET switching circuit 28 operates in a circuit isolation mode (that is, the MOSFET switching circuit is off) when a predetermined voltage is applied to MOSFETs Q3 and Q4. However, turning the MOSFET switching circuit 28 off, and keeping it off, is far more difficult than turning on the MOSFET switching circuit 28 as discussed above. This difficulty arises from the fact that MOSFETs exhibit a great deal of capacitive characteristics and AC signals may pass through capacitors. As a result of the capacitive nature of MOSFETs, a positive charge can be coupled to the gate in relationship with the source node. When this occurs, the MOSFET briefly turns on. A MOSFET circuit that can conduct DC voltage in two directions may, therefore, not be suited for switching AC power.

With this in mind, the present MOSFET switching circuit has been developed in an effort to ensure that the switch accurately is turned off, and remains off. In accordance with the disclosed MOSFET switching circuit 28, MOSFETs Q1 and Q2 block the passage of electricity when Vgs=0. To ensure that $Vgs_1=0$ and $Vgs_2=0$, the device providing a voltage to G1 and G2 is turned off and voltage is applied to G4 (in relationship to S2/S4) and applied to G3 (in relationship to S1/S3). By positively biasing the Vgs voltage of MOSFETs Q3 and Q4 a low resistance is established between the gate and source of MOSFETs Q1 and Q2 (typically less than 10 ohms). If any parasitic charge is coupled to G1 and/or G2, it is quickly dissipated by a low resistance connection provided by MOSFETs Q3 and Q4, and the switch remains off.

It should be understood that there is no relationship between the voltage on G1 and the voltage on G2. In addition, no relationship exists between these voltages and the ground potential. When both MOSFETs Q1 and Q2 are conducting, the voltages on G1 and G2 will be very close but separated by a voltage equal to the current through MOSFETs Q1 and Q2 times the combined resistance of the MOSFETs. Further, when MOSFETs Q1 and Q2 are conducting AC power, the voltage on G1 and the voltage on G2 will be some small DC voltage above the AC voltage, but exactly in phase with that voltage. Such an arrangement is necessary because the gate voltage must be greater than the source voltage at all times for the MOSFETs to conduct electricity.

Similarly, the voltage on G3 must be referenced only to S1/S3 and likewise the voltage at G4 must be referenced only to S2/S4. When the MOSFET switching circuit 28 is not conducting, the S1/S3 node may be at AC potential, and, therefore, G3 must be at a constant voltage above AQ while S2/S4 may be at ground potential with G3 at a voltage above ground (0V).

As mentioned above, the present relay utilizes a specific transformer arrangement 22 to control the MOSFET switching circuits 28 employed in accordance with a preferred embodiment of the present invention. Generally, each MOSFET switching circuit 28 is controlled by two distinct power sources. In order to maintain the unique voltage relationships required by the MOSFET switching circuit 28 described above, the voltage source must be isolated from all other voltages. In accordance with a preferred embodiment of the present invention, a pair of transformers 30, 32 is utilized in applying the required isolated voltages to the MOSFET switching circuit 28. That is, transformer coupled power is utilized to provide the isolated voltages required in operating the MOSFET switching circuit 28 described above. It is further contemplated that a battery or charged capacitor may be used in accordance with the present MOSFET switching circuit, and the voltage may be applied or removed from the gate using optical isolation. Other similar isolated power sources may also be used without departing from the spirit of the present invention.

Figure 3:
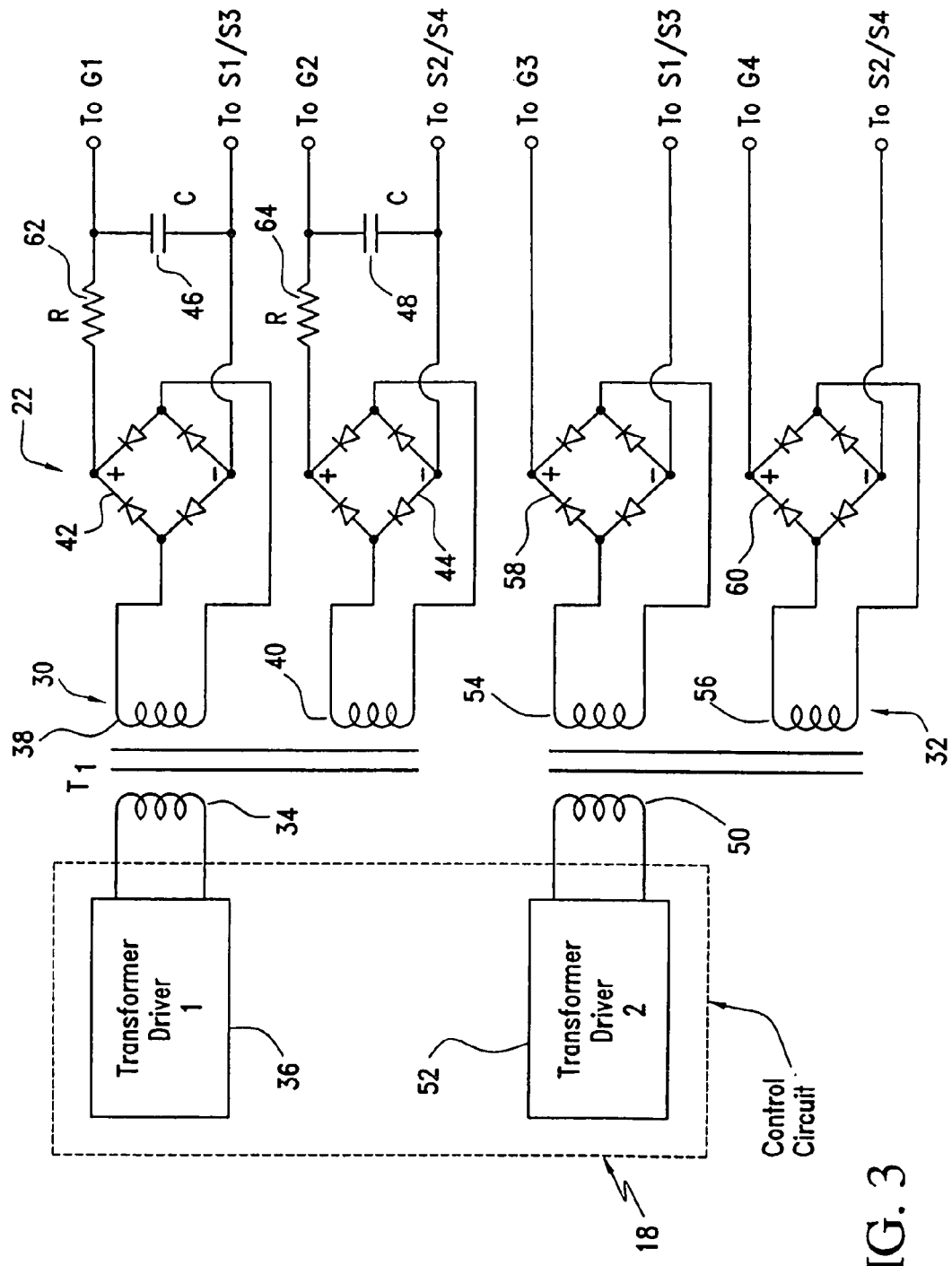
FIG. 3 is a schematic of the transformer system utilized in accordance with the present invention.

FIG. 3 discloses a preferred transformer arrangement 22 for powering the MOSFET switching circuit 28 depicted in FIG. 2. As shown in FIG. 3, the first transformer 30 includes a primary winding 34 connected to an AC driving circuit 36, a first secondary winding 38 and a second secondary winding 40. Each of the first and second secondary windings 38, 40 is connected to a full bridge rectifier 42, 44 with capacitors 46, 48 on the rectifier outputs. These rectified outputs are labeled with reference to their relationship to the gates and sources of MOSFETs Q1 and Q2. When an AC source is applied to the first transformer 30, positive voltage is quickly produced on each gate relative to its source. The transformer arrangement 22 also includes capacitors 46, 48 which add stability to the power MOSFETs Q1 and Q2 and helps limit the problems associated with parasitic charges.

The second transformer 32 is similarly configured for MOSFETs Q3 and Q4. As such, the second transformer 32 includes a primary winding 50 connected to an AC driving circuit 52, a first secondary winding 54 and a second secondary winding 56. Each of the first and second secondary windings 54, 56 is connected to a full bridge rectifier 58, 60. The rectified outputs are labeled with reference to their relationship to the gates and sources of MOSFETs Q3 and Q4. As such, when an AC source is applied to the second transformer 32, positive voltage is quickly produced on each gate relative to its source. This positive voltage turns of the MOSFET switching circuit 28, and keeps the MOSFET switching circuit 28 off.

In use, when the first transformer 30 is turned off and the second transformer 32 is turned on, the gates of MOSFETs Q3 and Q4 charge rapidly, since there is little capacitance. When the gates are sufficiently charged, MOSFETs Q3 and Q4 discharge the Vgs voltage of Q1 and Q2, turning the main power of the MOSFET switching circuit 28 off and holding it off by providing a low resistance between the gate and source of MOSFETs Q1 and Q2. MOSFETs Q3 and Q4 are less susceptible to capacitive parasitics and so did not require additional capacitance to protect them from such effects. Since MOSFETs Q3 and Q4 have much lower capacitance, the gate charge will drain quickly when the second transformer 32 is turned off. In addition, system efficiency may be improved by providing MOSFETs Q3 and Q4 with high resistance at their respective gate to source resistors.

Operation of the disclosed transformer system 22 is enhanced by the provision of respective resistors 62, 64 between the first and second rectifiers 42, 44 and their respective capacitors 46, 48. The provision of a resistor 62, 64 between the first and second rectifiers 42, 44 enhances operation by limiting current flow while MOSFETs Q3 and Q4 are turning off. Because the MOSFETs only require power while switching (enough current to charge or discharge the gates), the power delivered by the transformers 30, 32 can be small. For example, the inventor has used a 5V CMOS circuit as a driver for the transformers. This minimal current requirement makes electronic relay design even more power efficient.

Transformer coupled power is utilized in accordance with a preferred embodiment of the present invention as transformer coupling reacts relatively rapidly and is also relatively efficient. Also, transformer coupling allows for the grouping of functions while maintaining proper isolation. For example, G1 and G2 can both be driven by secondary windings 38, 40 of the same first transformer 30. Similarly, G3 and G4 are driven by secondary windings 54, 56 of the same second transformer 32. Transformer couplings can easily provide 1500V of isolation while quickly and efficiently coupling power so that no storage device is needed. In fact, the use of isolated power sources in accordance with the present invention, allows for response time in the range of nanoseconds. It is contemplated that the ability of the present circuits to offer fast switching makes them highly appropriate for use in the manufacture of electronic circuit breakers.

As discussed above and as those skilled in the art will certainly appreciate, the circuitry described above provides for the application of normally closed contacts 14a, 14b, 14c without the need for additional power inputs. The present arrangement achieves this by utilizing the power generated by the power supply 20 of the control/sensing circuitry 18 to power the normally closed contacts 14a, 14b, 14c when no power is supplied via the "sense voltage" input.

More specifically, a small amount of power is gleaned from the control/sensing circuitry 18. All inputs of the relay 10, both switched inputs and sense inputs, are connected to rectifiers 42, 44, 58, 60 so that a voltage differential existing between any two input pins becomes a voltage source. The voltage source is used to power the relay 10 and provide power to the normally closed contacts 14a, 14b, 14c when no power exists at the sense voltage input. This power supply 20 also allows the relay 10 to perform monitoring and communication functions regardless of the condition of the sense input.

In accordance with a further embodiment of the present invention, the MOSFET switching circuits 28, as well as the transformer assembly 22 discussed above, may be combined to provide for improved power handling and isolation. Specifically, and with reference to FIG. 4, three of the MOSFET switching circuits 28 described above are combined to produce an AC relay block 66 adapted for functioning as an AC power control system. As will be better appreciated based upon the following discussion, each AC relay block 66 is well suited for controlling the flow of electricity therethrough and may consequently be used in various power control applications (e.g., power control with inductive loads, multiple-pole/multiple throw systems, etc.).

Generally, a first MOSFET block 28' (composed of the MOSFET switching circuit 28 described above with reference to FIG. 2) and a second MOSFET block 28" (composed of the MOSFET switching circuit 28 described above with reference to FIG. 2) are electrically connected in series between a first terminal 68 and a second terminal 70. An electrical connection member 72 connects the first MOSFET block 28' and the second MOSFET block 28", and a third MOSFET block 28''' (composed of the MOSFET switching circuit 28 described above with reference to FIG. 2) extends between the electrical connection member 72 and ground 74.

This system is designed to allow power to flow from a first terminal 68 to a second terminal 70 in either direction by turning on the first and second MOSFET blocks 28', 28", and turning off the third MOSFET block 28'''. In this mode, AC or DC power can flow from a source at the first terminal 68 to a load at the second terminal 70 or in the reverse direction from a source at the second terminal 70 to a load at the first terminal 68.

The MOSFET blocks 28', 28", 28''' behave as variable resistors, and operation of the disclosed AC relay blocks 28', 28", 28''' may be explained in terms of resistance. In the conduction mode with the first and second MOSFET blocks 28', 28" turned on, the first MOSFET block 28' and the second MOSFET block 28" have low resistance (less then 1 ohm, typically less then 1/10 ohm) and the third MOSFET block 28''' has high resistance (above 10 Meg Ohm, possibly as high as 100 Meg Ohm).

Figure 5:
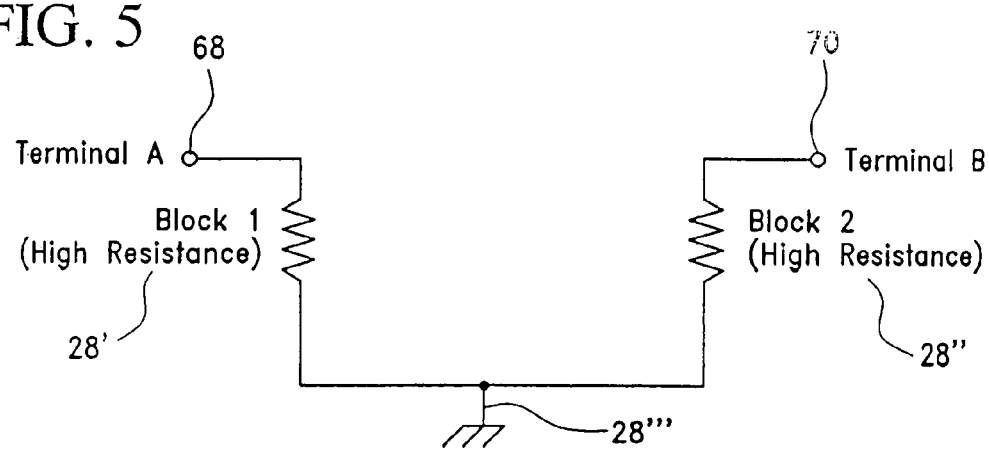
FIG. 5 is a schematic of the AC relay block in isolation mode.

With reference to FIG. 5, the purpose of the third MOSFET block 28''' is best appreciated when one considers operation of the AC relay block 66 in isolation mode. Specifically, when power must be isolated from the load, that is, when the AC relay block enters isolation mode, the first MOSFET block 28' and the second MOSFET block 28" are turned off and the third MOSFET block 28''' is turned on. When the AC relay block 66 is placed in isolation mode as described above, the first and second MOSFET blocks 28', 28" are considered to behave like high value resistors (greater then 10 Meg Ohm each) and the third MOSFET block 28''' behaves like a low value resistor (less than 1 ohm). As such, when the AC relay block 66 is in isolation mode it behaves in the manner shown in FIG. 5, with the third MOSFET block 28''' serving the purpose of a grounding circuit.

The inclusion of such a grounding circuit in isolation mode is necessary for many applications since the MOSFETs behave as variable resistors and not as actual switches providing an actual electrical gap. If the circuit consisted of only the first and second MOSFET blocks, although there would be a great deal of resistance between and the first terminal and the second terminal, there would still be a current path. If a load were small, or if the load terminal had no-load connected, a voltage would still be measured on the load terminal even when the MOSFET blocks were in isolation mode. By adding the third MOSFET block as a grounding circuit, such a problem is completely eliminated and a safer relay is produced.

Figure 4:
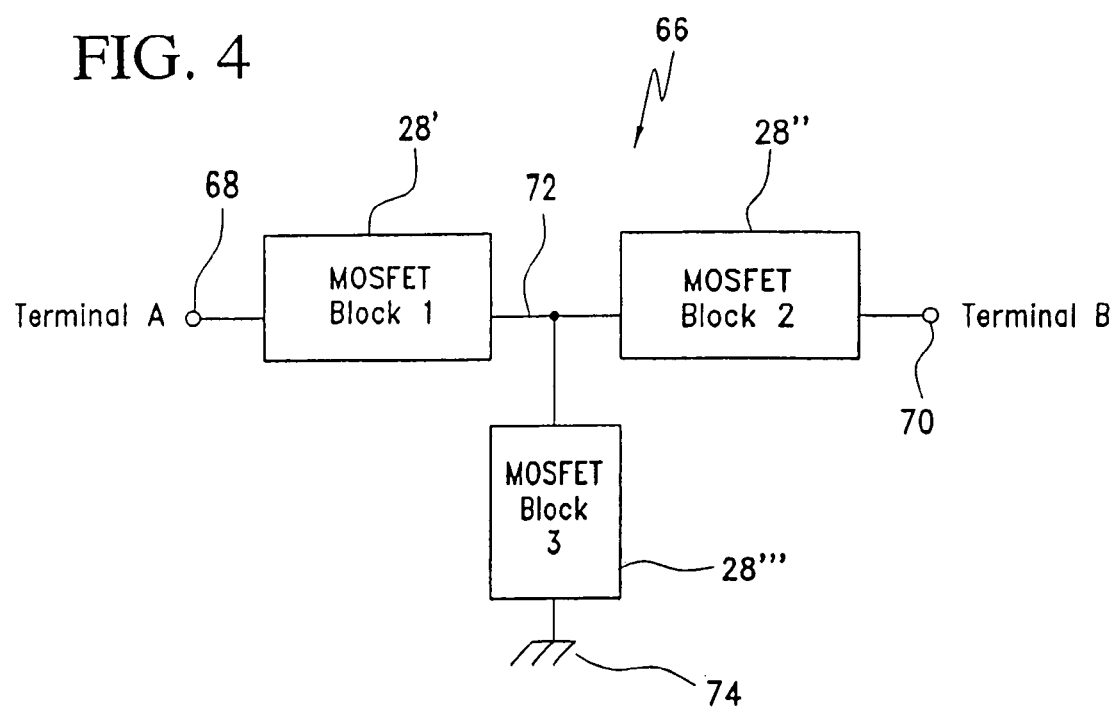
FIG. 4 is a schematic of an AC relay block.
Figure 6:
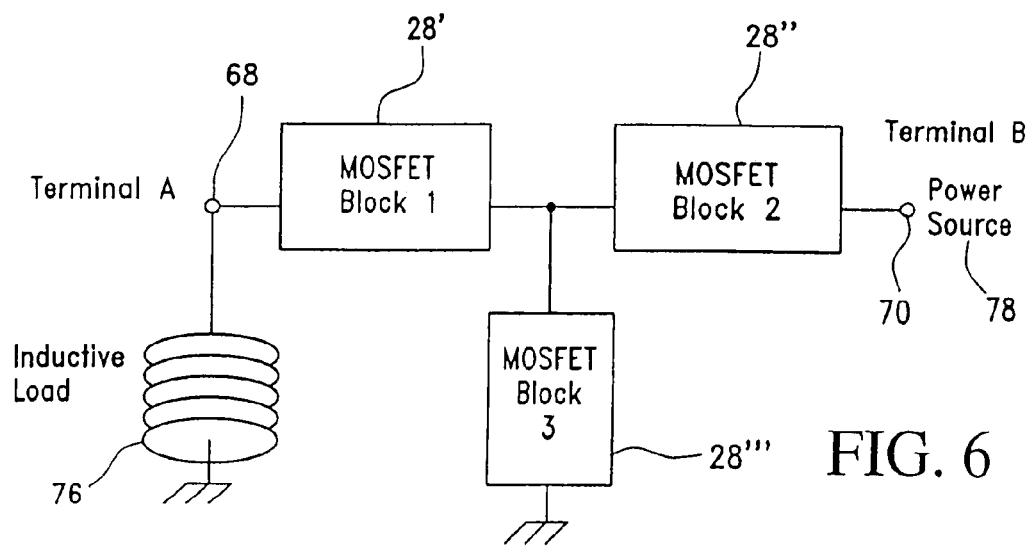
FIG. 6 is a schematic of the AC relay block with an inductive load.
Figure 7:
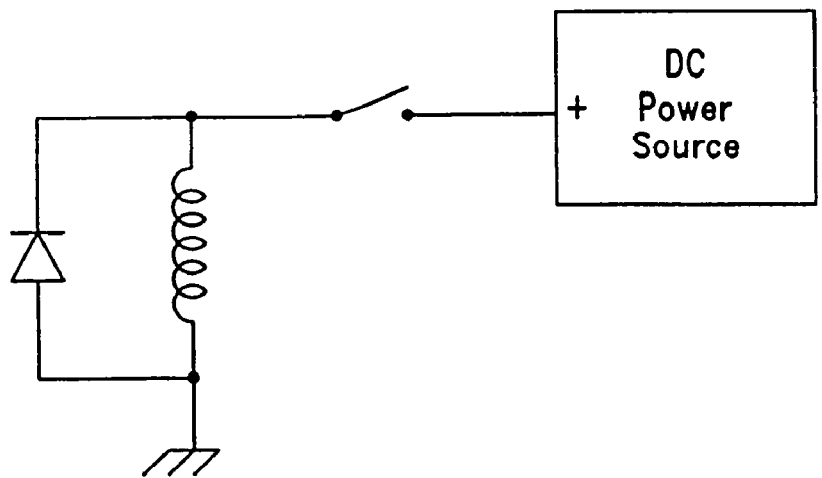
FIGS. 7 and 7a are schematics of prior art systems for disclosing the handling of inductive loads in combination with a DC power source.
Figure 7A:
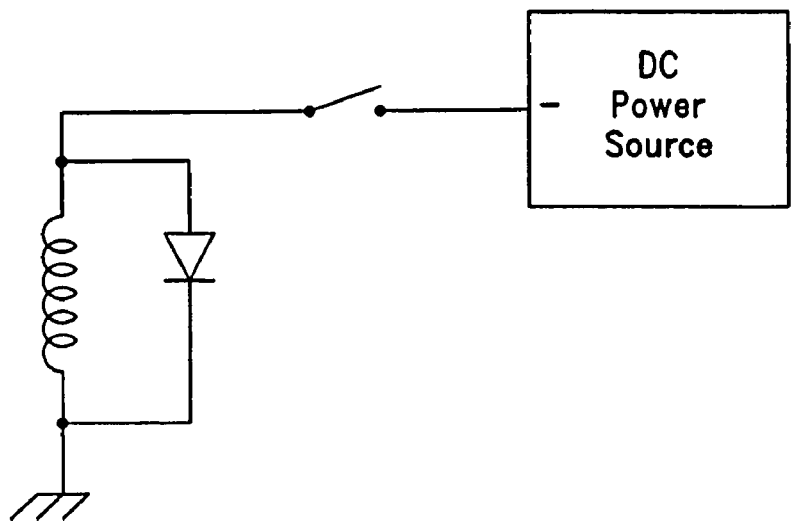

With reference to FIG. 6, the AC relay block 66 disclosed in FIG. 4 is described with an inductive load 76 connected thereto. The problem with inductive loads is the inductive discharge caused by the changes in current through the inductor. When an inductive load is utilized in DC systems, the inductive discharge caused by the change in current of the inductor is commonly dealt with through the use of a diode in parallel with the inductive load. Such an arrangement is shown in FIGS. 7 and 7a. In order for the simple circuit solution shown in FIGS. 7 and 7a to be effective, however, the polarity of the power and the direction of the current through the inductor must be known. As such, the utilization of the diode, as with the DC system disclosed in FIGS. 7 and 7a, is not practical when an AC power source is applied. Specifically, when an AC power source is applied, the direction of the current through the coil (polarity of the voltage) when the system changes from conduction mode to isolation mode cannot be predicted. Furthermore, when multiphase AC power is being controlled, it is difficult, if not impossible, to select when in the AC cycle each phase is to be switched. It is also desirably to switch all phases simultaneously.

Figure 8:
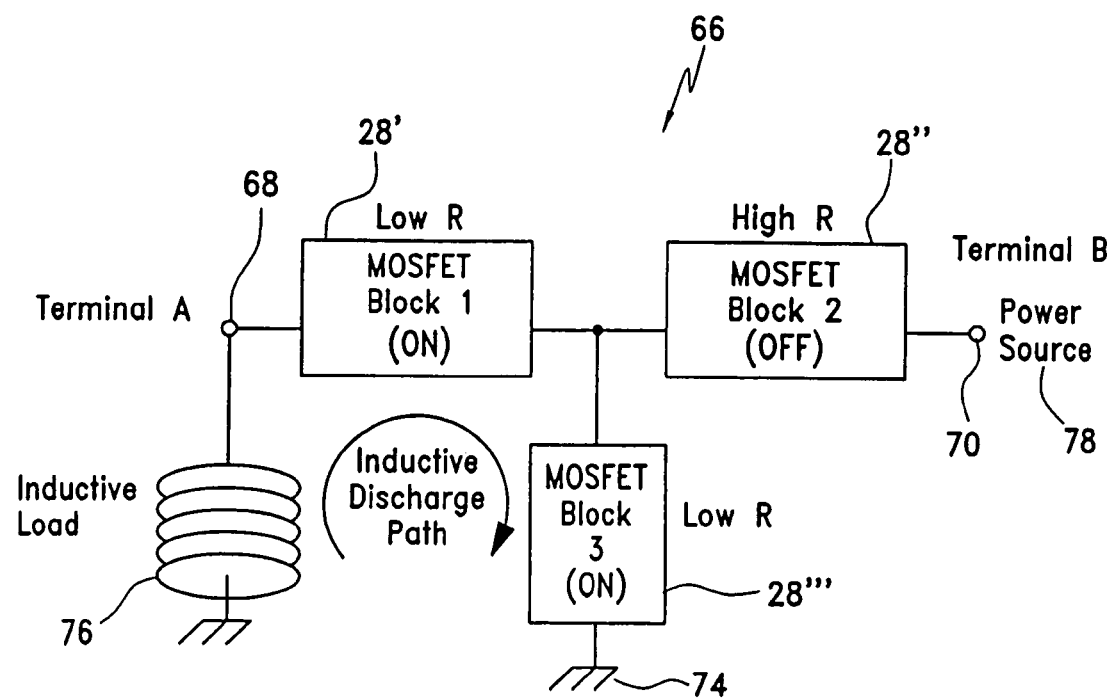
FIG. 8 is a schematic showing the AC relay block when configured for inductive discharge.

In accordance with a preferred embodiment of the present invention, the AC relay block 66 disclosed in FIG. 4 is very capable of handling an inductive load 76. With reference to FIG. 6, and in accordance with a preferred embodiment of the present invention, the inductive load 76 is connected to the first terminal 68 and the AC power source 78 is connected to the second terminal 70. The function of this circuit is now described by way of example. Specifically, when the system is in conduction mode, the first MOSFET block 28' and the second MOSFET block 28" are in conducting mode (on) and the third MOSFET block 28''' is in non-conducting mode (off). When the AC power is removed, and it is necessary to provide the inductive discharge with a path to ground, the second MOSFET block 28" is placed in non-conducting mode (off) and the third MOSFET block 28''' is placed in conducting mode (on). Referring to FIG. 8, this permits the inductive discharge to discharge to ground 74 without an excess of voltage being created. After the inductive discharge is completed, the system is switched to isolation mode (with the first and second MOSFET blocks 28', 28" off and the third MOSFET block 28''' on). In fact, the inductive discharge mode is actually a modified isolation mode.

Figure 9:
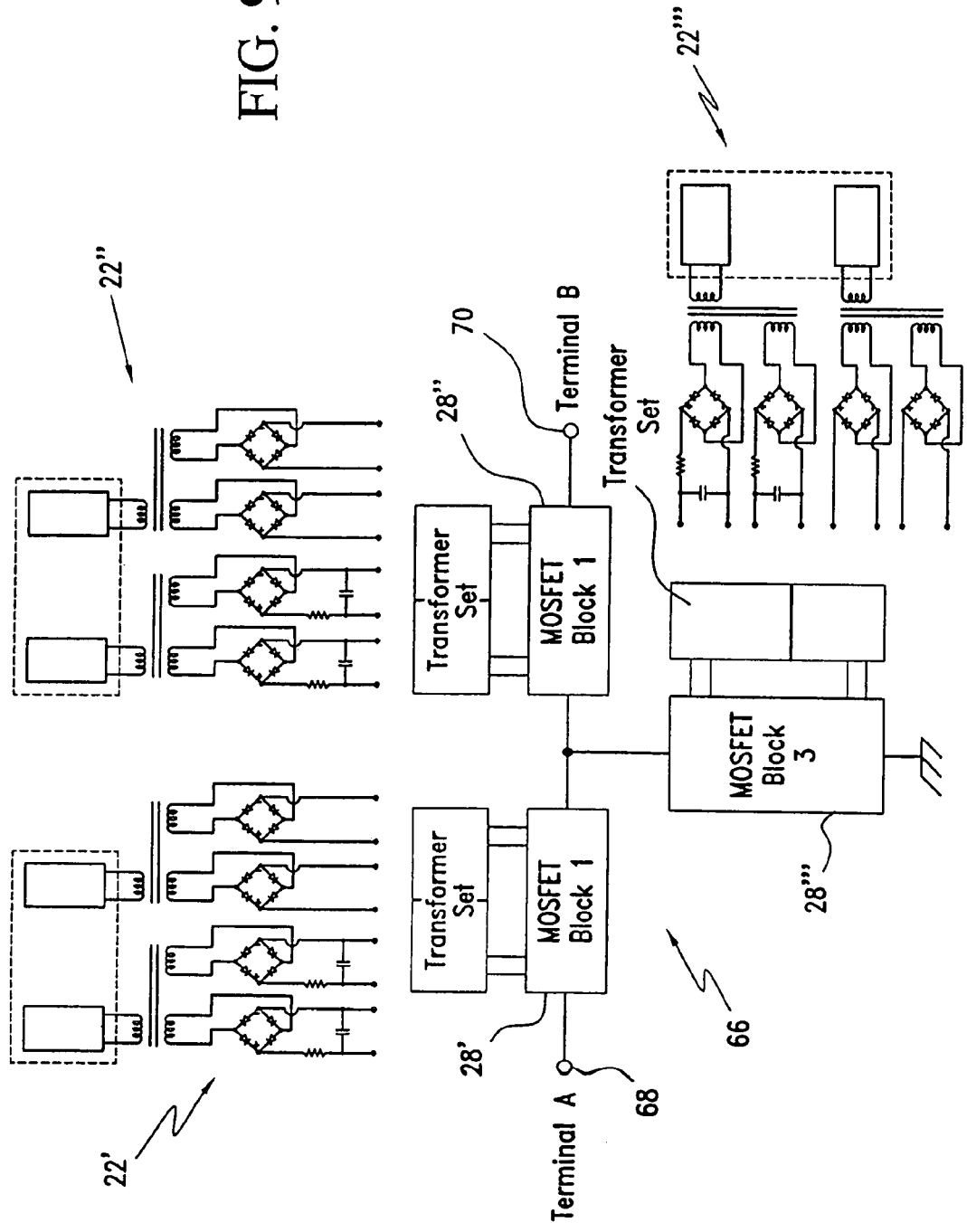
FIG. 9 is a schematic of the AC relay block of FIG. 4 with transformers associated therewith.

With reference to FIG. 9, the AC relay block 66 of FIG. 4 is disclosed in conjunction with the transformers and transformer driving circuitry discussed above. As discussed above, and in accordance with a preferred embodiment of the present invention, the transformers and transformer driver circuitry form part of the control/sensing circuitry 18. The control/sensing circuitry 18 includes all of the analog and digital electronics allowing the AC relay block 66 to function. In addition to the transformers and the transformer driving circuitry 22, the control/sensing circuitry 18 includes control voltage sensing circuits 24 and control logic 26.

Once again with reference to FIG. 9, the transformers and the transformer driving circuitry provide the isolated gate to source voltages (Vgs) critical to the operation of the present AC relay block 66. In accordance with a preferred embodiment of the present invention, each MOSFET switching circuit 28', 28'', 28''' making up the AC relay block 66 is provided with an exclusive transformer set 22', 22'', 22''' including a set of two exclusively operating transformers. As such, three sets of transformers (6 transformers total) are required for operation of the AC relay block 66 disclosed with reference to FIG. 4.

Specifically, the first MOSFET block 28', i.e., MOSFET switching circuit, is electrically coupled to first and second transformers 30', 32'. The first transformer 30' includes a primary winding 34' connected to an AC driving circuit 36', a first secondary winding 38' and a second secondary winding 40'. Each of the first and second secondary windings 38', 40' is connected to a full bridge rectifier 42', 44' with capacitors 46', 48' on the rectifier outputs. These rectified outputs are labeled with reference to their relationship to the gates of MOSFETs Q1 and Q2 of the first MOSFET block 28'. When an AC source is applied to the first transformer 30', its positive voltage is quickly produced on each gate relative to its source. The second transformer 32' is similarly configured for MOSFETs Q3 and Q4 of the first MOSFET block 28'. As such, the second transformer 32' includes a primary winding 50' connected to an AC driving circuit 52' a first secondary winding 54' and a second secondary winding 56'. Each of the first and second secondary windings 54', 56' is connected to a full bridge rectifier 58', 60'. These rectified outputs are labeled with reference to their relationship to the gates of MOSFETs Q3 and Q4 of the first MOSFET block 28'. As such, when an AC source is applied to the second transformer 32', positive voltage is quickly produced on each gate relative to its source. Use of the transformer assembly 22' in driving the first MOSFET block 28' is described above.

Similarly, the second MOSFET block 28'' is electrically coupled to third and fourth transformers 30'', 32''. The third transformer 30'' includes a primary winding 34'' connected to an AC driving circuit 36'', a first secondary winding 38'' and a second secondary winding 40''. Each of the first and second secondary windings 38'', 40'' is connected to a full bridge rectifier 42'', 44'' with capacitors 46'', 48'' on the rectifier outputs. These rectified outputs are labeled with reference to their relationship to the gates of MOSFETs Q1 and Q2 of the second MOSFET block 28''. When an AC source is applied to the third transformer 30'', its positive voltage is quickly produced on each gate relative to its source. The fourth transformer 32'' is similarly configured for MOSFETs Q3 and Q4 of the second MOSFET block 28''. As such, the fourth transformer 32'' includes a primary winding 50'' connected to an AC driving circuit 52'', a first secondary winding 54'' and a second secondary winding 56''. Each of the first and second secondary windings 54'', 56'' is connected to a full bridge rectifier 58'', 60''. These rectified outputs are labeled with reference to their relationship to the gates of the second MOSFETs Q3 and Q4 of the second MOSFET block 28''. As such, when an AC source is applied to the fourth transformer 32'', positive voltage is quickly produced on each gate relative to its source.

The third MOSFET block 28''' is electrically coupled to fifth and sixth transformers 30''', 32'''. The fifth transformer 30''' includes a primary winding 34''' connected to an AC driving circuit 36''', a first secondary winding 38''' and a second secondary winding 40'''. Each of the first and second secondary windings 38''', 40''' is connected to a full bridge rectifier 42''', 44''' with capacitors 46''', 48''' on the rectifier outputs. These rectified outputs are labeled with reference to their relationship to the gates of the MOSFETs Q1 and Q2 of the third MOSFET block 28'''. When an AC source is applied to the fifth transformer 30''', its positive voltage is quickly produced on each gate relative to its source. The sixth transformer 32''' is similarly configured for MOSFETs Q3 and Q4 of the third MOSFET block 28'''. As such, the sixth transformer 32''' includes a primary winding connected to an AC driving circuit 52''', a first secondary winding 54''' and a second secondary winding 56'''. Each of the first and second secondary windings 54''', 56''' is connected to a full bridge rectifier 58''', 60'''. These rectified outputs are labeled with reference to their relationship to the gates of the MOSFETs Q3 and Q4 of the third MOSFET block 28'''. As such, when an AC source is applied to the sixth transformer 32''', positive voltage is quickly produced on each gate relative to its source.

It is contemplated that multiple AC relay blocks may be operated in parallel for multi-phase control using only six transformers with multiple windings. For example, and considering a three-phase system (triple-pole, single-throw) it is contemplated that six transformers with six secondary windings each may be utilized. In accordance with a preferred embodiment of the present invention, toroid-core transformers operating at 3 MHz with a CMOS driving circuit are utilized. However, those skilled in the art will appreciate that other core configurations, frequencies, and driving circuits would similarly function and may be utilized without departing from the spirit of the present invention.

Figure 10:
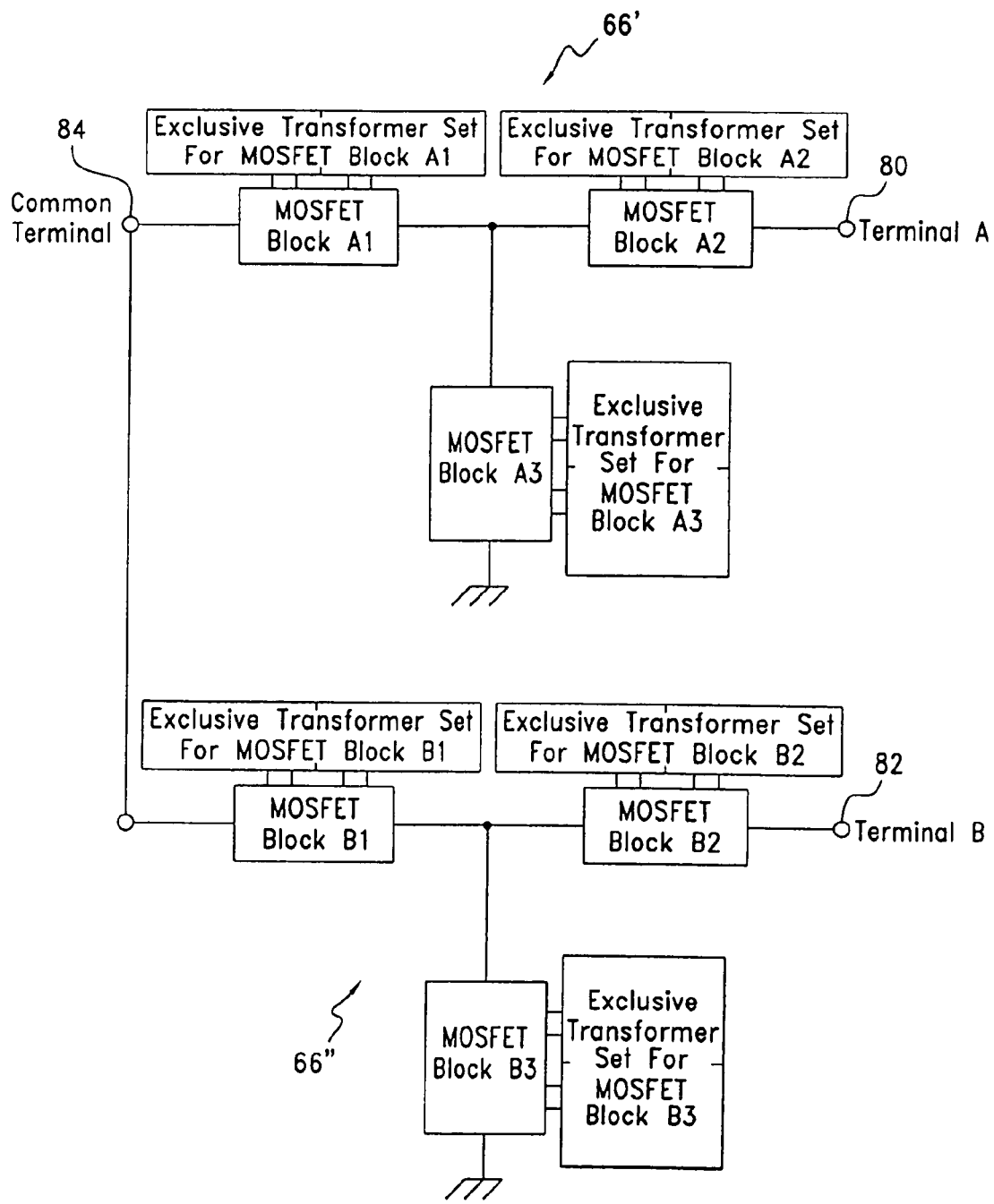
FIG. 10 is a schematic of a double-throw system constructed with AC relay blocks.
Figure 11:
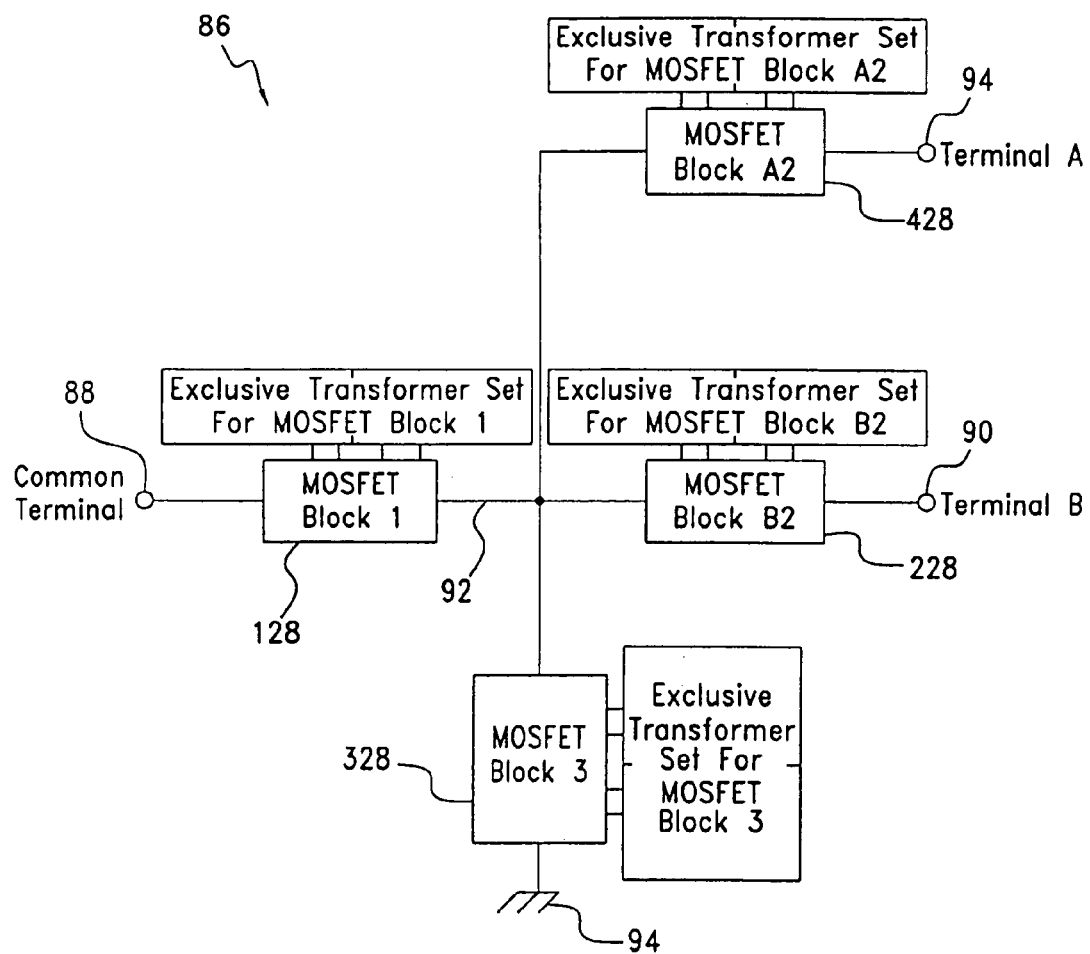
FIG. 11 is a schematic of a modified double-throw system constructed with AC relay blocks.

If one were to construct a system utilizing the present AC relay blocks in a double-throw arrangement, two parallel AC relay blocks 66', 66'' could be utilized as shown in FIG. 10. Such a system requires twice as many transformers to ensure that each side of the system is capable of handling inductive discharge and complete AC power isolation. The double-throw arrangement disclosed in FIG. 10 employs first and second AC relay blocks 66', 66'' connected in parallel so as to handle to separate power sources (one connected to the first terminal 80 and one connected to the second terminal 82) as well as a single load (connected to the common terminal 84). Similarly, the system disclosed with reference to FIG. 10 may handle two loads (one connected to the first terminal 80 and one connected to the second terminal 82) with a single power source connected to the common terminal 84.

In use, the double-throw circuit utilizing parallel AC relay blocks 66', 66'' as disclosed in FIG. 10 requires that the inductive discharge of either the first or second AC relay block 66', 66'' be dissipated before the other AC relay block is allowed to turn on. The control logic 26 must also be provided with information as to which side (common or normally open/normally closed) has the load(s) attached thereto, since the inductive discharge is a function of the load and must be properly handled to avoid damaging the overall system. If the control logic 26 were to attempt to ground inductive discharge on the power side of the AC relay block 66', 66'', the power would be shorted to ground. As such, the present system requires that the AC relay block 66', 66'' be connected with load on the properly marked side or that a configuration switch be utilize so as to selectively indicate that the AC relay block 66', 66'' is connected. However, it is contemplated that the determination as to which side the load is connected may be determined through the use of automatic detection means, and such automatic detection means would certainly fall within the spirit of the present invention.

An alternate embodiment of a double-throw system utilizing the present AC relay blocks discussed above is shown in FIG. 11. This modified double-throw system 86 includes a first MOSFET block 128 (composed of the MOSFET switching circuit 28 described above with reference to FIG. 2) and a second MOSFET block 228 (composed of the MOSFET switching circuit 28 described above with reference to FIG. 2) electrically connected in series between a common terminal 88 and a first terminal 90. An electrical connection member 92 connects the first MOSFET block 128 and the second MOSFET block 228, and a third MOSFET block 328 (composed of the MOSFET switching circuit 28 described above with reference to FIG. 2) extends between the electrical connection member 92 and ground 94. The double-throw functionality of this modified double-throw system 86 is provided by the inclusion of a fourth MOSFET block 428 (composed of the MOSFET switching circuit 428 described above with reference to FIG. 2) extending between the electrical connection member 92 and a second terminal 94.

In general, this modified double-throw system 86 combines the common terminal and ground branches of the first and second AC relay blocks utilized in the double-throw system disclosed with reference to FIG. 10. This eliminates some of the MOSFETs and transformers required where a double-throw circuit is implemented as disclosed above with reference to FIG. 10. Specifically, the modified double-throw system utilizing the present AC relay blocks requires four fewer power MOSFETs, four fewer switching MOSFETs, and four fewer transformers. While the modified double-throw system disclosed with reference to FIG. 11 requires fewer MOSFETs and transformers, it is contemplated that this modified double-throw system would be able to handle much less voltage differential when using MOSFETs similar to those utilized with reference to the double-throw system employing parallel AC relay blocks as disclosed with reference to FIG. 10. As such, if one wishes to design the modified double-throw system to handle the same voltage differentials as the parallel AC relay block double-throw system of FIG. 10, the modified double-throw system would require MOSFETs having doubled the voltage rating of those used in the parallel AC relay block double-throw system.

The parallel double-throw circuit described above with reference to FIG. 10 offers many advantages over prior double-throw circuits. Specifically, the present double-throw circuit offers greater voltage isolation between two different power sources or between power sources which are out of phase, more control over inductive discharge and the ability to switch between two loads faster than previously possible (that is, one load may be inductively discharged while the other load is powering up).

In addition to including the transformers and transformer driving circuitry 22, the control/sensing circuitry 18 includes control voltage sensing circuit 24. The control voltage sensing circuit 24 senses the control voltage to determine when the various MOSFETs making up the relay should be switched on or off. In prior art electromechanical relay systems, this function is accomplished by the pick-up and drop-out characteristics of the relay system coil. In electronic relay systems such as the present MOSFET based electronic relay, the pick-up and drop-out characteristics of the coil must be emulated.

It is currently known to use RMS to DC conversion integrated circuits for the purpose of emulating the pick-up or drop-out characteristics of the coil. Similarly, a simple method of rectifying the AC into a capacitor is well known in the prior art for emulating the pick-up or dropout characteristics of the coil. However, each of these techniques requires several AC cycles to settle or reach a steady state output. Unfortunately, the present relay requires quicker response and waiting several AC cycles to reach a steady state output is unacceptable.

Figure 12:
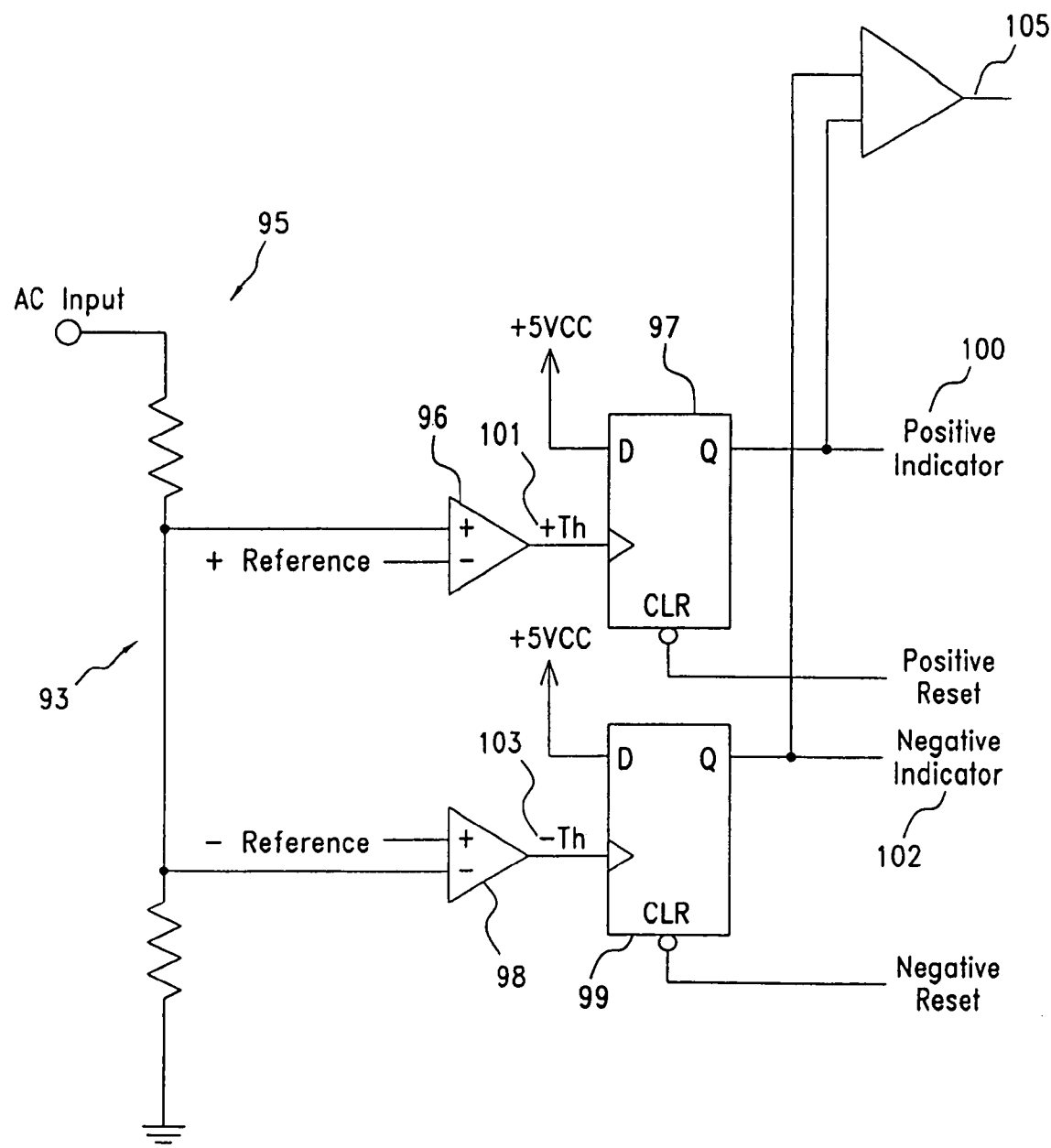
FIG. 12 is a schematic of an AC voltage peak detection circuit.

In an effort to reach a steady state output over a single AC cycle, the present invention utilizes a combination of a digital state machine, digital data traps and analog comparators. For each desired voltage level, two comparators are used. As shown in FIG. 12, a first comparator 96 measures the voltage peak during the positive half cycle of the AC cycle and the second comparator 98 measures the voltage peak during the negative half of the AC cycle. The first and second comparators 96, 98 receive the scaled AC voltage (a voltage scaled by the resistor divider network 93) as inputs to be compared to a positive reference and a negative reference, respectively. The positive reference and negative reference are of equal magnitude, but opposite polarity. Both the first and second comparators output high-voltage when the magnitude of the AC voltage exceeds the predetermined threshold (which is selectively established by operators of the present system). Each of the first and second comparators 96, 98 forces a "set" condition in its respective flip-flop 97, 99 (the set condition being +Th 101 and −Th 103). That is, when either the first or second comparators 96, 98 sense a voltage of greater magnitude than the threshold value, the comparator output goes high, causing a clock event on the flip-flop 97, 99. The flip-flop 97, 99 then registers the logical "1" set by the connection of the data input to VCC. The flip flops 97, 99 in this configuration amount to a digital "trap". That is, a device that traps and holds the data until needed.

Figure 13:
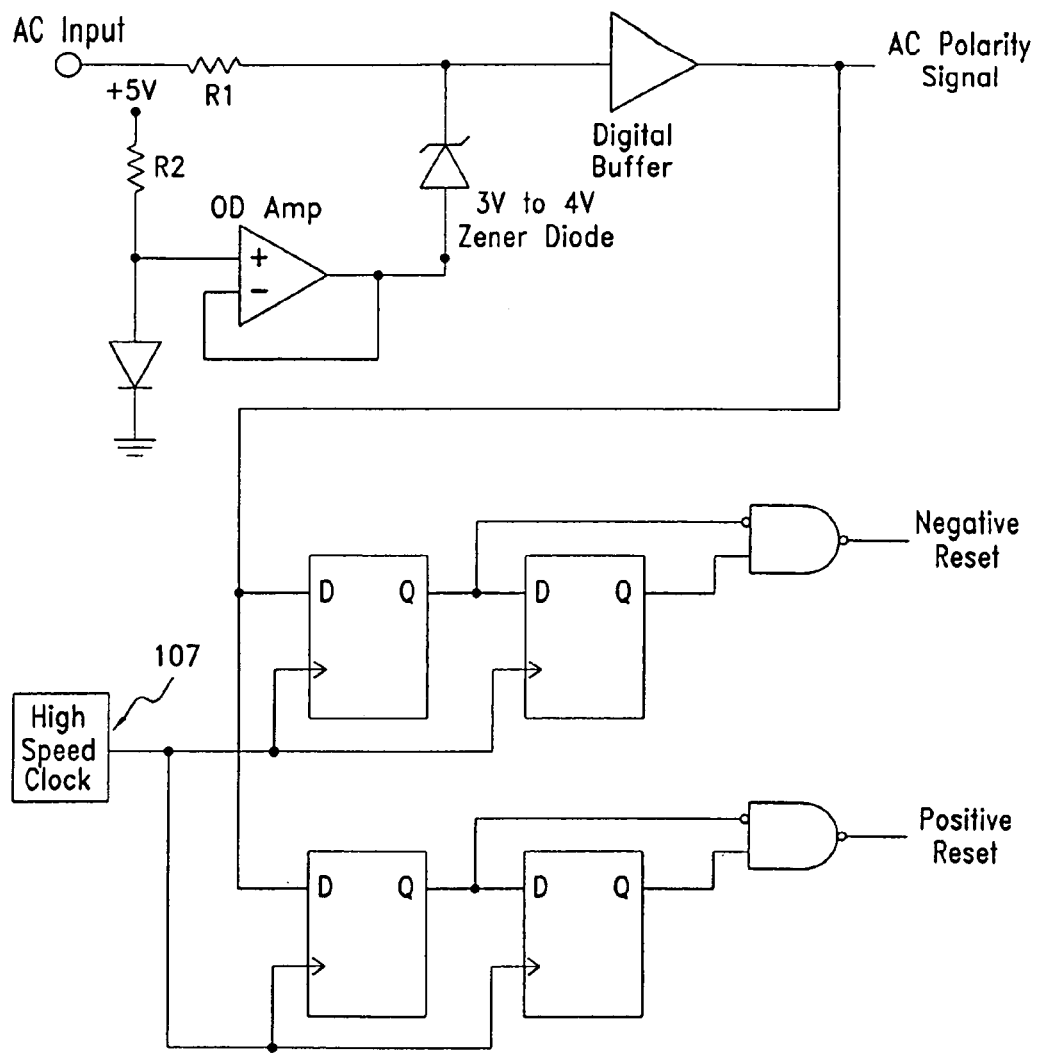
FIG. 13 is a schematic of an AC polarity signal circuit.
Figure 14:
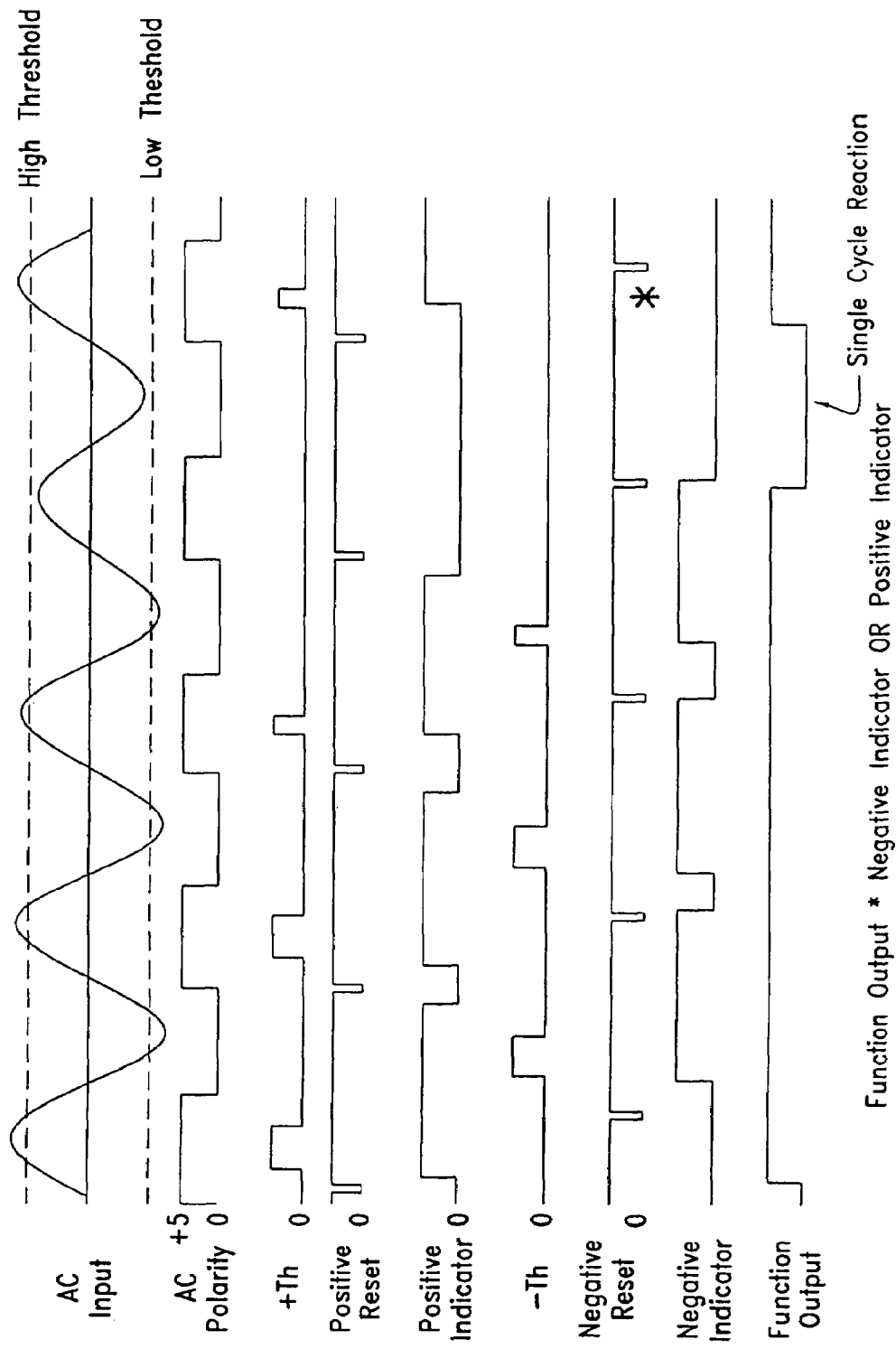
FIG. 14 show various AC voltage waveforms associated with the AC voltage peak detection circuit and AC polarity signal circuit.

The respective positive indicator 100 or negative indicator 102 employed by the first and second comparators 96, 98 of the control voltage sensing circuit 24 remain true until reset by a polarity detection circuit 104 as shown in FIG. 13. Operation of the polarity detection circuit 104 requires the inclusion of a clock 107 that must be run at greater than 120 Hz for 60 Hz power (although other operating speeds are contemplated in accordance with other applications). In utilizing such a polarity detection circuit 104, it is contemplated that it maybe necessary to place voltage limiters and analog or digital filters on the +Th 101 and −Th 103 signals before they reach the respective flip-flops of the first and second comparators 96, 98 in order to ensure proper transient conditions. The positive indicator 100 and negative indicator 102 signals are combined by a logical OR to produce a function output signal 105. This signal represents the combined AC threshold and reacts within one AC cycle of threshold crossing. The timing waveforms of the AC power input and the various signals described above and illustrated with reference to FIGS. 12 and 13 are shown in FIG. 14. It is further contemplated that the outputs of the first and second comparators (+Th and −Th) or the positive indicator or negative indicator signals may be input into a digital state machine or microprocessor to allow faster response. (for example, ½ AC cycle) and to allow more detailed control functions.

Figure 15:
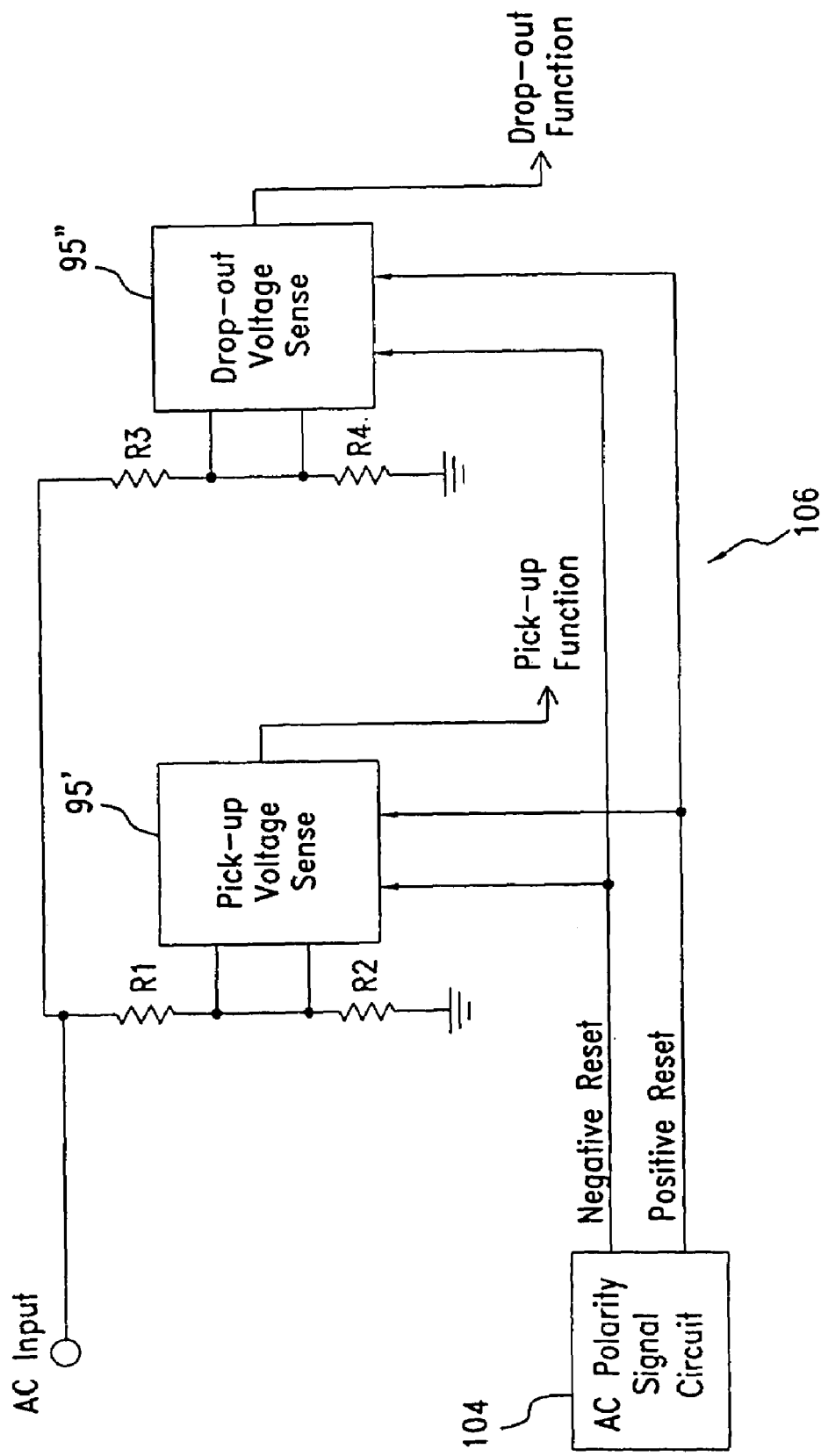
FIG. 15 is a schematic of a two-part dual comparator system.

In order to complete the relay function, a pick-up voltage and a drop-out voltage must both be accounted for. The dual comparator circuit 95 (i.e., first and second comparators 96, 98, as well as the first and second flip flops 97, 99) described above serves to detect one voltage level. Where a system includes a distinct pick-up voltage and a distinct drop-out voltage, two such dual comparator circuits must be used and compared for proper operation. Such a two-part dual com parator system 106 for use in accordance with a preferred embodiment of the present invention is disclosed in FIG. 15. Specifically, FIG. 15 illustrates the combination of two dual comparator circuits 95', 95" to produce both a pick-up function and a drop-out function as required in certain applications of the present invention. The respective pick-up voltage sensor first block (i.e., first dual comparator circuit 95') and drop-out voltage sensor second block (i.e., second dual comparator circuit 95") both contain the same dual comparator circuitry shown in FIG. 12. In addition, both the first block 95' and the second block 95" include either a logical OR gate or a state machine as described previously to produce the proper pick-up or drop-out functions. The only difference between the dual comparator circuits shown in FIG. 15 and those previously described with reference to FIGS. 12 and 13 are the resistor divider networks (R1 and R2, R3 and R4) that serve to select the voltage threshold. The AC polarity signal circuit 104, the same as illustrated in FIG. 13, produces the negative reset and positive reset signals that are shared with all control voltage sensing circuits on that particular AC line.

As those skilled in the art will certainly appreciate, a system may be built with numerous pick-up and drop-out voltage levels as selected by the user. All of the of voltage sensing circuits discussed above share positive and negative reference voltages as well as positive and negative reset signals.

In addition to the transformers, a transformer driving circuitry 22 and control voltage sensing circuits 24, the control/sensing circuitry 18 includes control logic 26. The control logic 26 coordinates all of the activities of the various components of the present relay (whether it is composed of one AC relay block or MOSFET switching circuit or multiple AC relay blocks or MOSFET switching circuits) and performs critical timing of functions.

The first function of the control logic 26 is to determine when the relay should be on or off. In electromechanical relays the pick-up voltage is higher than the drop-out voltage. This is a result of the physics of the coil/actuator assembly and offers the advantage of providing the relay with hysteresis that eliminates unstable behavior. In order to emulate this function as provided in electromechanical relays, solid state relays such as the present relay must utilize a state machine to provide the proper control outputs.

Figure 16:
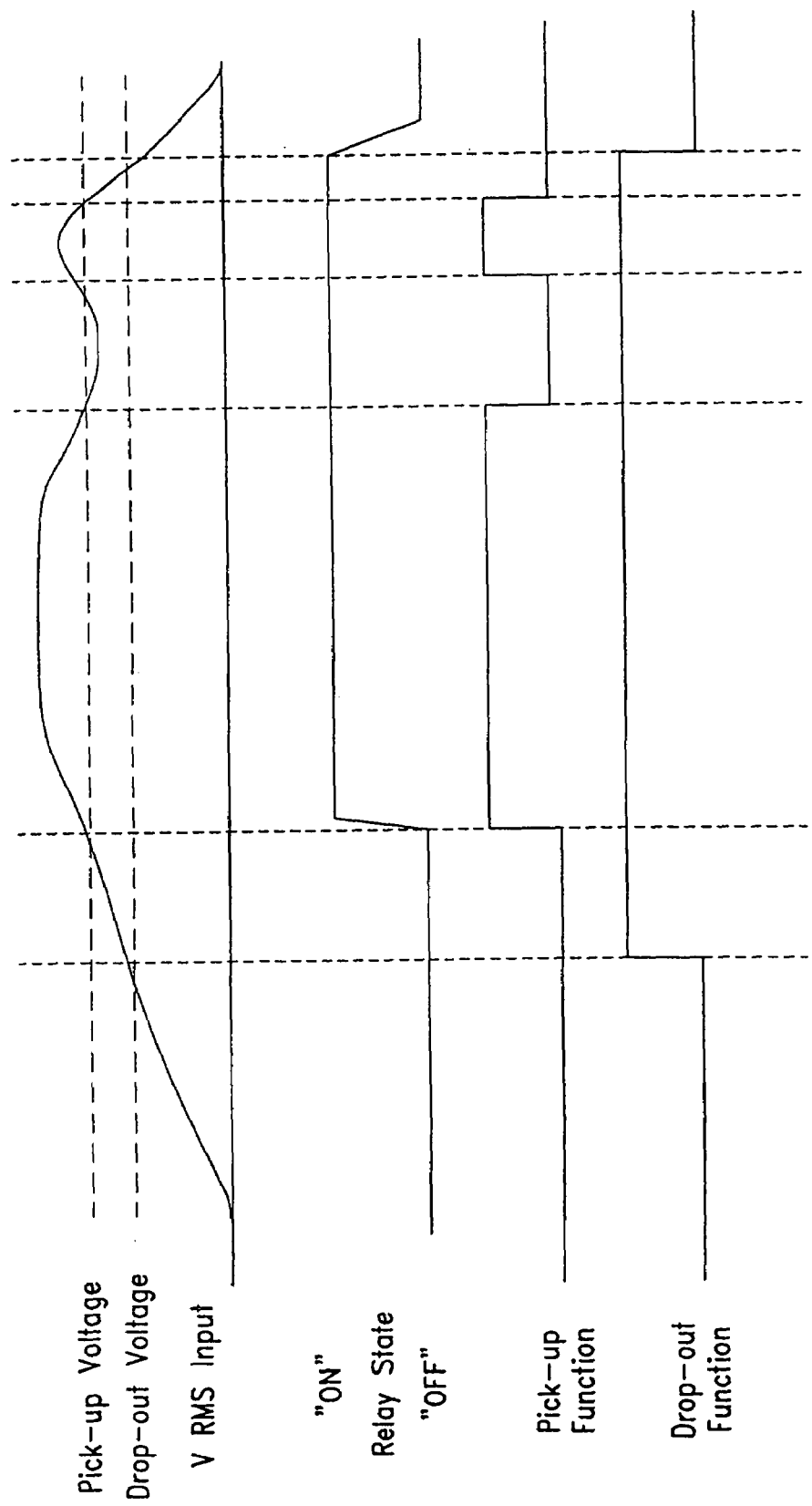
FIG. 16 shows various waveforms associated with the relay state condition in comparison to pick-up and drop-out voltages.
Figure 17:
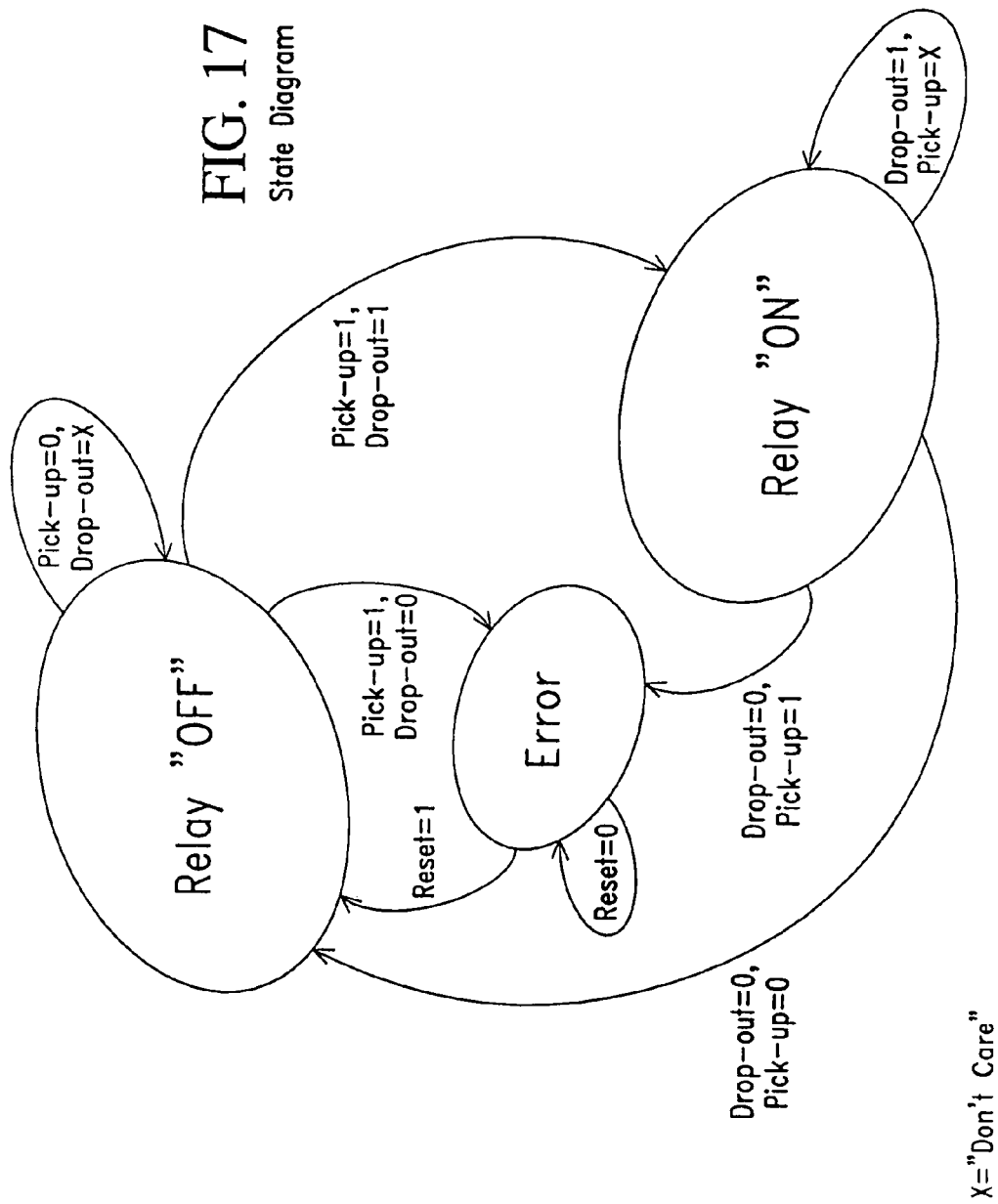
FIG. 17 is a flow diagram of a switching function state machine.

Referring to FIG. 16, the relationship between the relay condition and the pick-up and drop-out voltages is disclosed. Specifically, the relay is to remain off until the AC voltage reaches the pick-up threshold. Once the pick-up threshold is reached, the relay is to turn on and will not turn off until the AC voltage drops below the drop-out threshold. Since the condition of the relay depends on whether the pick-up threshold has been reached, a state machine or a microprocessor function is required. In accordance with a preferred embodiment of the present invention, a simple three-state state machine is utilized. In accordance with a preferred embodiment, the state machine is realized in programmable logic to perform the control switching function. The logic for such a state machine is disclosed with reference to FIG. 17. As those skilled in the art will certainly appreciate, the state machine may be realized in a microprocessor, in discreet logic, in an ASIC, or by other methods without departing from the spirit of the present invention.

In addition to determining when the relay should be turned on or off, the control logic 26 monitors and controls the timing of the switching of various blocks, for example, the AC relay block described above with reference to FIG. 4, making up the relay. When the electronic relay is off, some of the isolation transformers may remain on, forcing some of the MOSFETs to conduct. If the relay is a normally-open/normally-closed relay (i.e., a double-throw relay), one AC relay block will be conducting while the other is off. The AC relay block that is not conducting will have its third MOSFET block conducting to ground, requiring that the related transformer be on. In either condition, normal or operating, half of the isolation transformers will always be operating. The control logic is responsible for handling and maintaining this requirement.

The control logic 26 is also responsible for the sequence in which the transformers and MOSFETs are switched. For example, in a conducting AC relay block that is turned off, the first or second MOSFET block of the AC relay block (that is, the arm connecting to the AC power) must be off before the vertical third MOSFET block of the AC relay block begins conducting. This is necessary in order to perform inductive discharge. The inductive discharge must be complete and the horizontal first or second MOSFET block of the AC relay block that connects to the load must be turned off before the second AC relay block may be turned on.

Further, where the AC relay block has been off and is now being turned on, the third MOSFET block (that is, the MOSFET block connecting to ground) must cease conducting before the first or second MOSFET blocks begin conducting. The control logic handles the timing and sequencing ensuring that these functions operate in the proper order and at the proper time.

In accordance with a preferred embodiment of the present invention, a programmable logic device manufactured by Altera Corporation is being utilized to perform these control functions. However, those skilled in the art will appreciate that other programmable logic devices or a programmed microprocessor may be utilized in the performance of this function without departing from the spirit of the present invention.

It is further contemplated that a current sensing resistor may be added to the third MOSFET block of the AC relay block and connected to an operational amplifier and analog comparator to determine whether the inductive discharge has completed.

Figure 18:
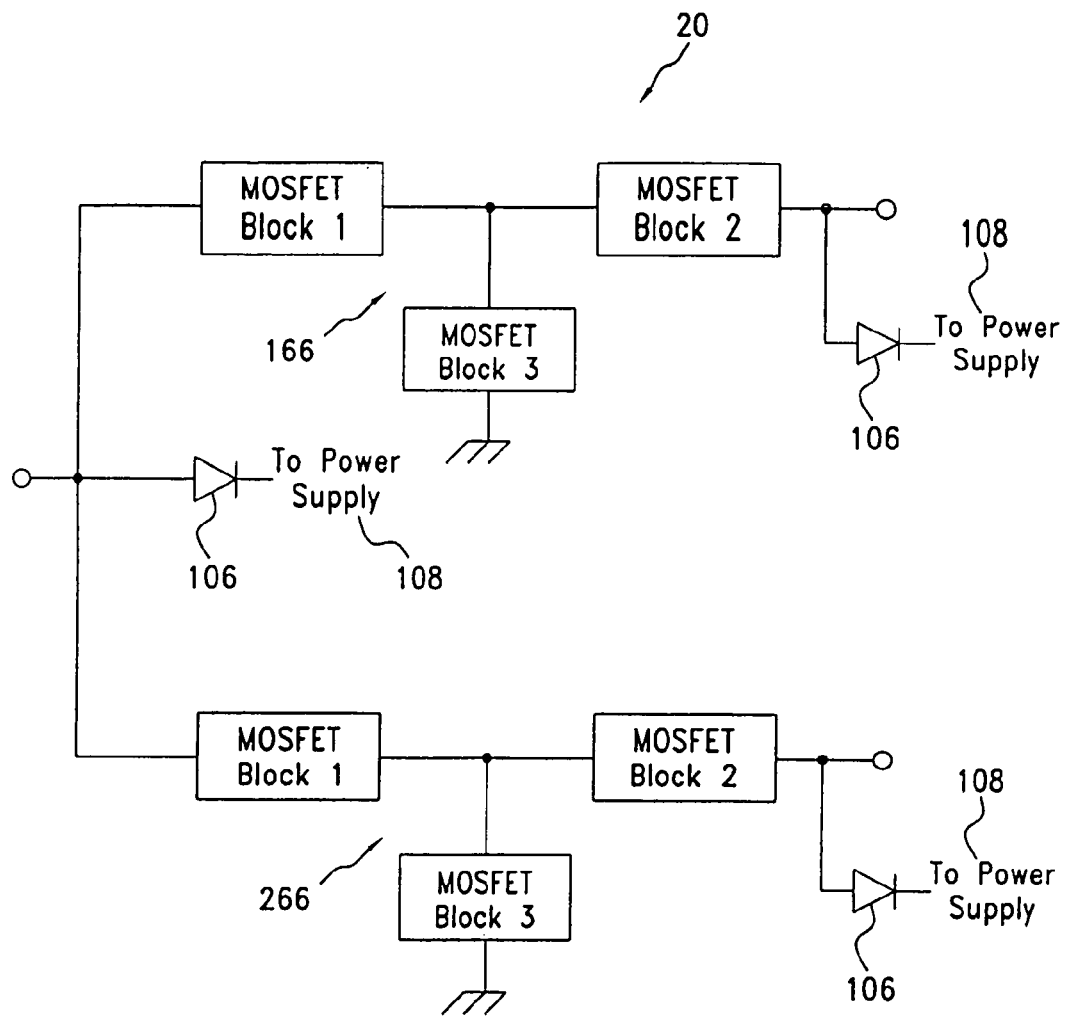
FIG. 18 is a schematic demonstrating the power supply for the present system.
Figure 18A:
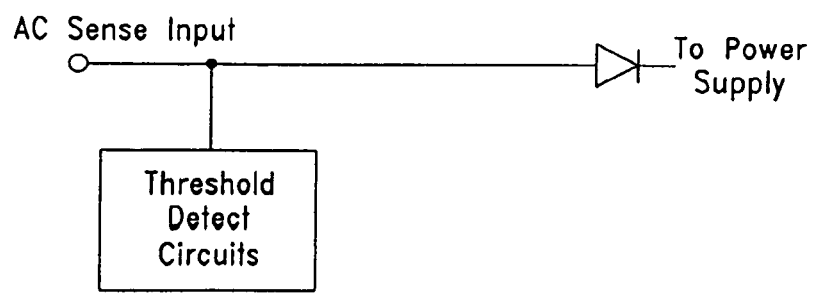
FIG. 18a shows a schematic of an alternate power supply in accordance with the present system.

As previously discussed above, the system requires a power supply 20 for use in energizing all the components utilized in accordance with the present invention. The power supply 20 in accordance with the present invention utilizes off-the-shelf technology with the exception of the diode 106 connected to all AC sources 108 so as to allow the relay and control logic 26 to maintain power when any of the connected AC sources have power. FIG. 18 shows a single diode 106 per power input connected for a double-throw combination of AC relay blocks 166, 266 in accordance with the present invention and the related sensed input. Half-wave and full-wave rectifiers may also be used to perform this function. The use of diodes and rectifiers allows for power if any input has power, without permitting voltage to cross from one terminal to any of the others. Referring to FIG. 18*a*, power may also be provided with an AC sense input using similar diodes.

Operation of the switching circuits, or relays, disclosed above in accordance with the various embodiments of the present invention is enhanced by the provision of an override/bypass switch 510 as disclosed with reference to FIGS. 19 to 25. The switch 510 is designed for use in controlling operation of a relay 511 composed of a MOSFET based, high voltage, high current AC electronic relay block 566, although those skilled in the art may appreciate other uses within the scope of the present invention. The override/bypass switch 510 allows an operator to easily disconnect a relay block 511 or to force the relay 511 to operate either locked in the "normal" configuration (see FIG. 23) or locked in the energized configuration (see FIG. 24).

In accordance with a preferred embodiment of the present invention, the override/bypass switch 510 includes two components; a key connector 512 (we call it a bypass "key" in some applications), which can be removed and repositioned, and a receptacle connector 514 on the override/bypass switch PCB. Briefly, the function of the override/bypass switch 510, and ultimately the relay 511 itself, is determined by the positioning of the key connector 512 within the receptacle connector 514. Functioning of the override/bypass switch 510 is also determined by the status of the contacts 516, 518, 520, 522, 524, 526 to which the key connector 512 it is connected. For example, where the override/bypass switch 510 is connected to a normally closed relay block 566 (as is the case in the embodiment disclosed in accordance with a preferred embodiment of the present invention), the normal mode (see FIG. 23) will lock the relay 511 in a closed configuration. In contrast, if the override/bypass switch were utilized in conjunction with a normally open relay block the normal mode would lock the relay in an open configuration. As such, the present disclosure relating to the operation of the override/bypass switch is not limited to applications with only normally closed relays or with the single pole double throw relay shown below in describing the present override/bypass switch, and those skilled in the art will most certainly appreciate potential variations residing within the scope of the present invention.

Figure 24:
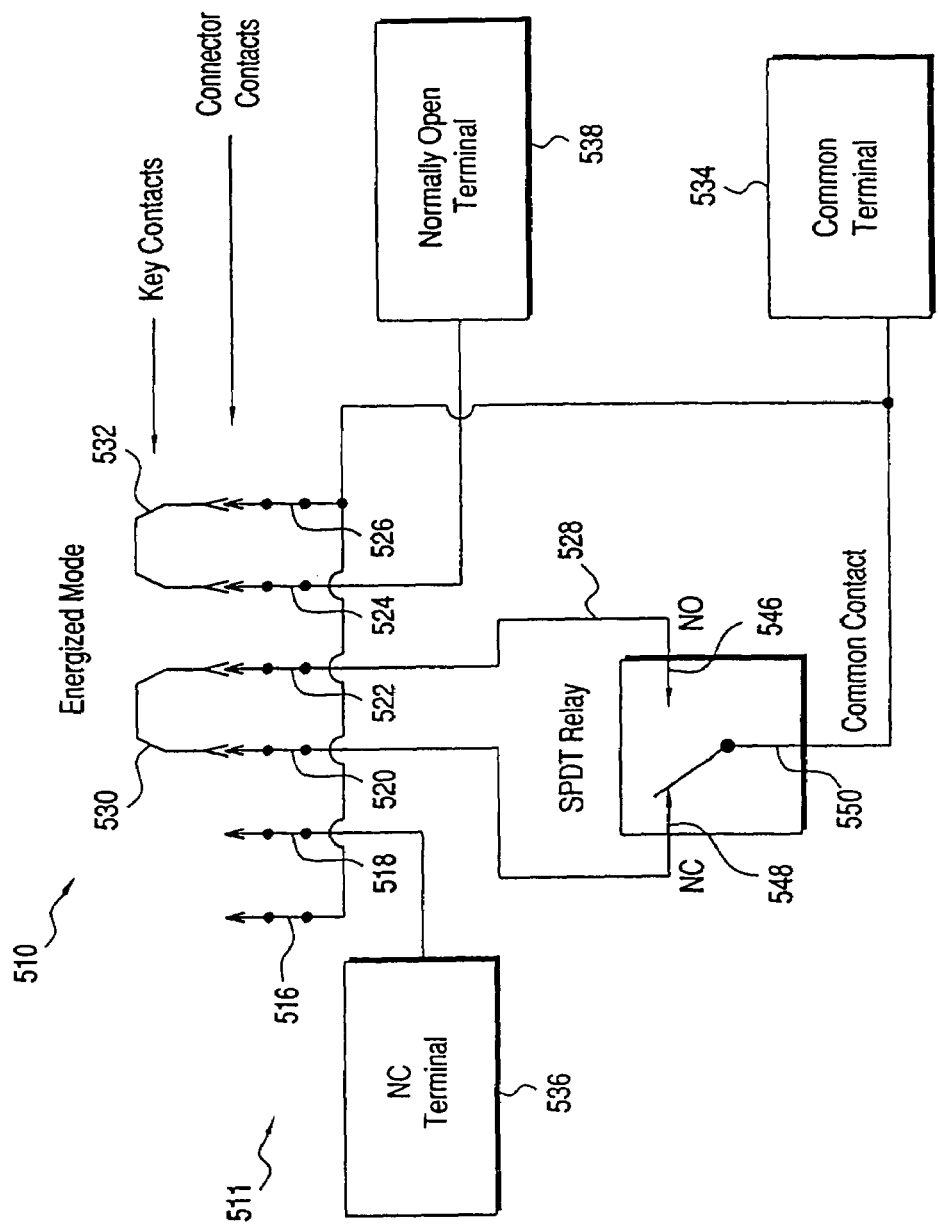
Figure 25:
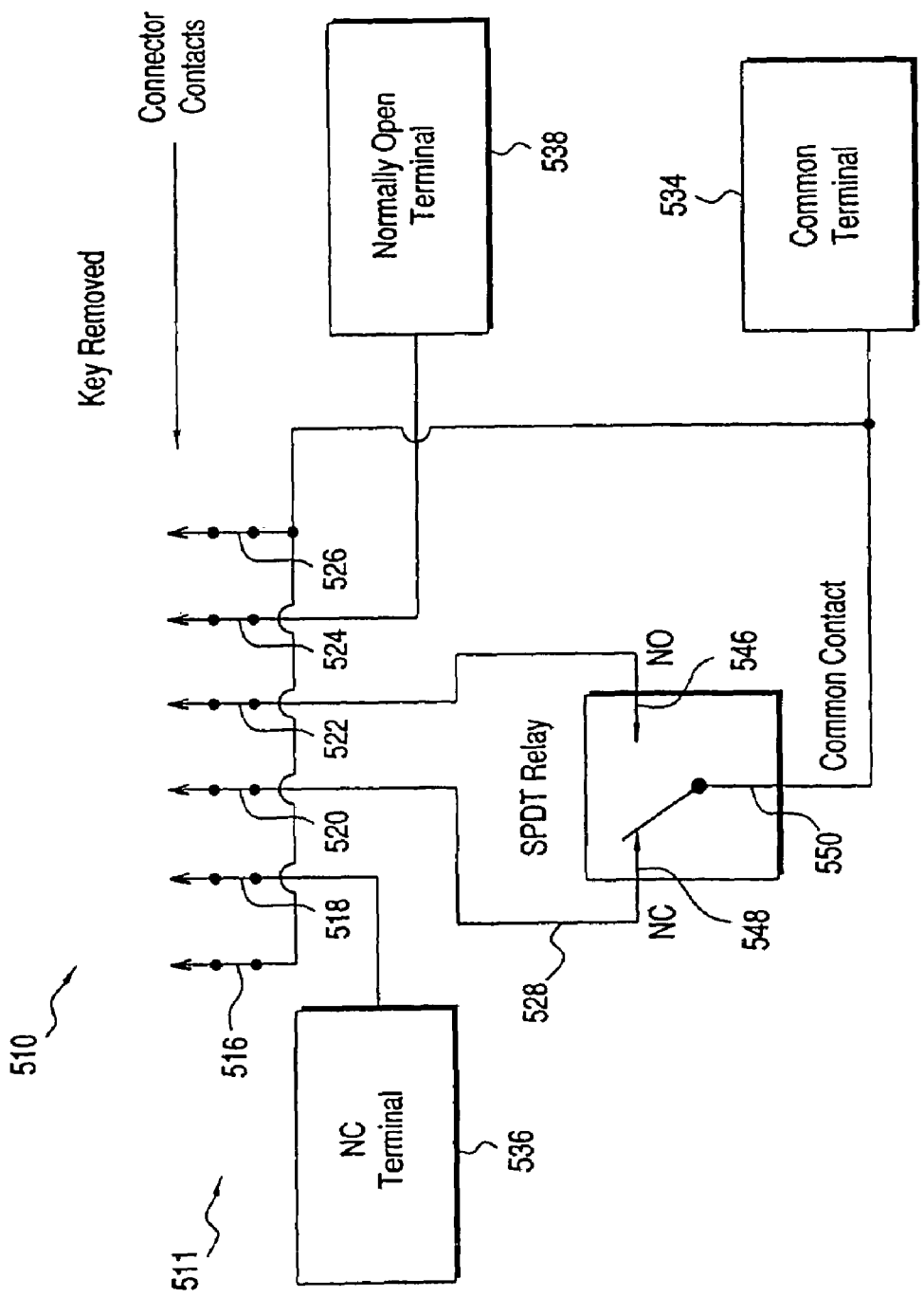

Briefly, if the key connector 512 is not installed, all terminals are disconnected (see FIG. 25). If the key connector 512 is installed in the center position ("AUTO"), the relay 511 is in automatic operating mode and is enabled to perform its normal functions (see FIG. 22). If the key connector 512 is installed to a first side, the relay 511 is locked in "normal" mode (see FIG. 23). And if the key connector 512 is installed toward a second side, opposite the first side, the relay 511 is locked in "energized" mode (see FIG. 24).

Figure 20:
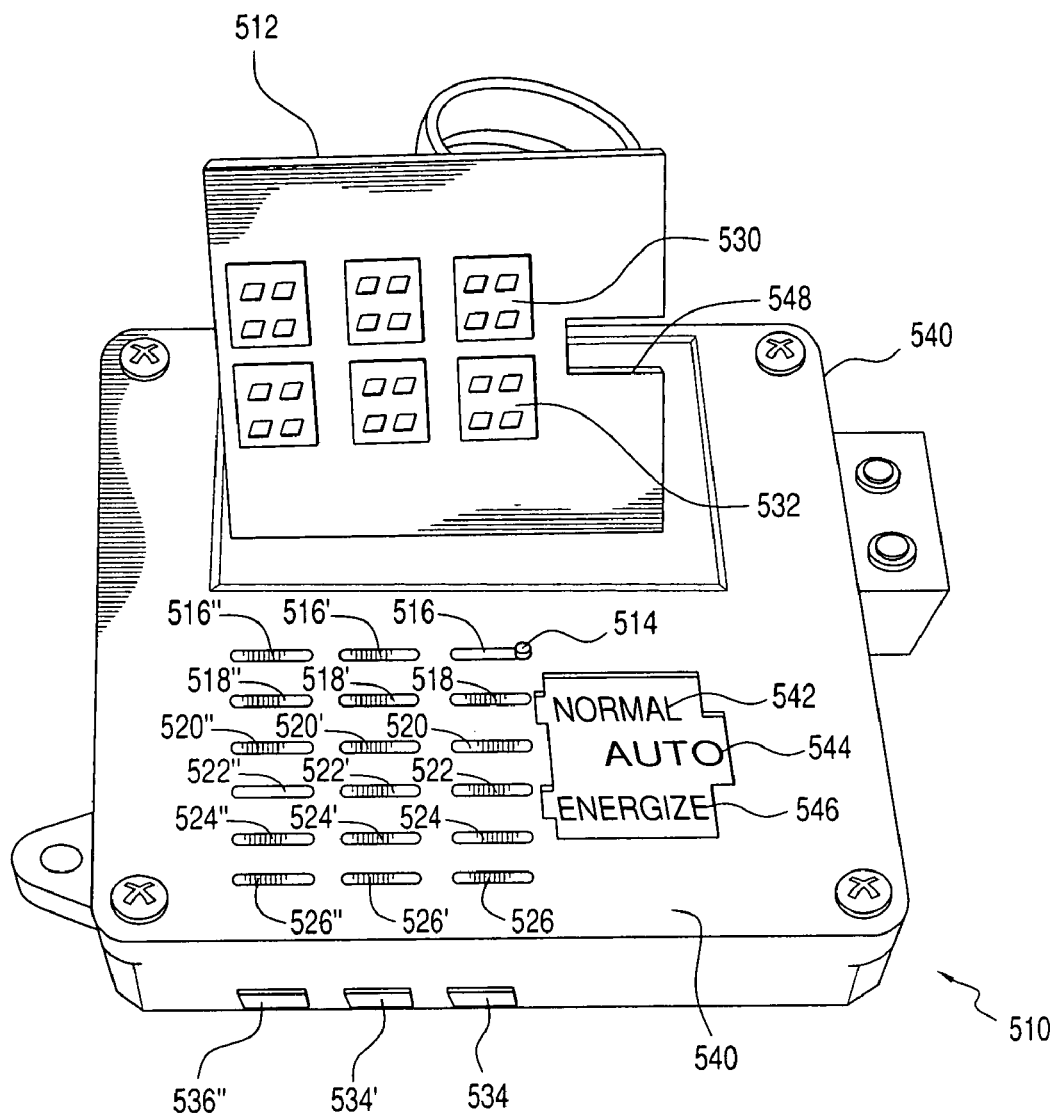
FIG. 20 is a top perspective view of the override/bypass switch shown in FIG. 19.

With this in mind, the receptacle connector 514 is provided with a plurality of contact points 516, 518, 520, 522, 524, 526 for engagement by the coupling members 530, 532 of the key connector 512. As is best shown in FIG. 20, the coupling members 530, 532 of the key connector 512 are utilized for selectively connecting various contacts 516, 518, 520, 522, 524, 526 provided within the receptacle connector 514. More specifically, the receptacle connector 514 is provided with a plurality of contacts 516, 518, 520, 522, 524, 526 for selective engagement with the key connector 512. The contacts 516, 518, 520, 522, 524, 526 include first and second common contacts 516, 526 connecting to a common terminal 534, first and second relay block contacts 520, 522 connecting to the relay block 566, a normally closed contact 518 coupled to a normally closed terminal 536 and a normally open contact 524 coupled to a normally open terminal 538. The key connector 512 is selectively positioned within the receptacle connector 514 for placing the relay 511 in an automatic mode, a normal mode or an energized mode. The interaction between the key connector 512 and the various contacts 516, 518, 520, 522, 524, 526 allows the operator to selectively connect the normally closed (NC) terminal 536, the normally open (NO) terminal 538, and the common terminal 534 in a variety of ways controlling operation of the relay 511 connected thereto.

Figure 19:
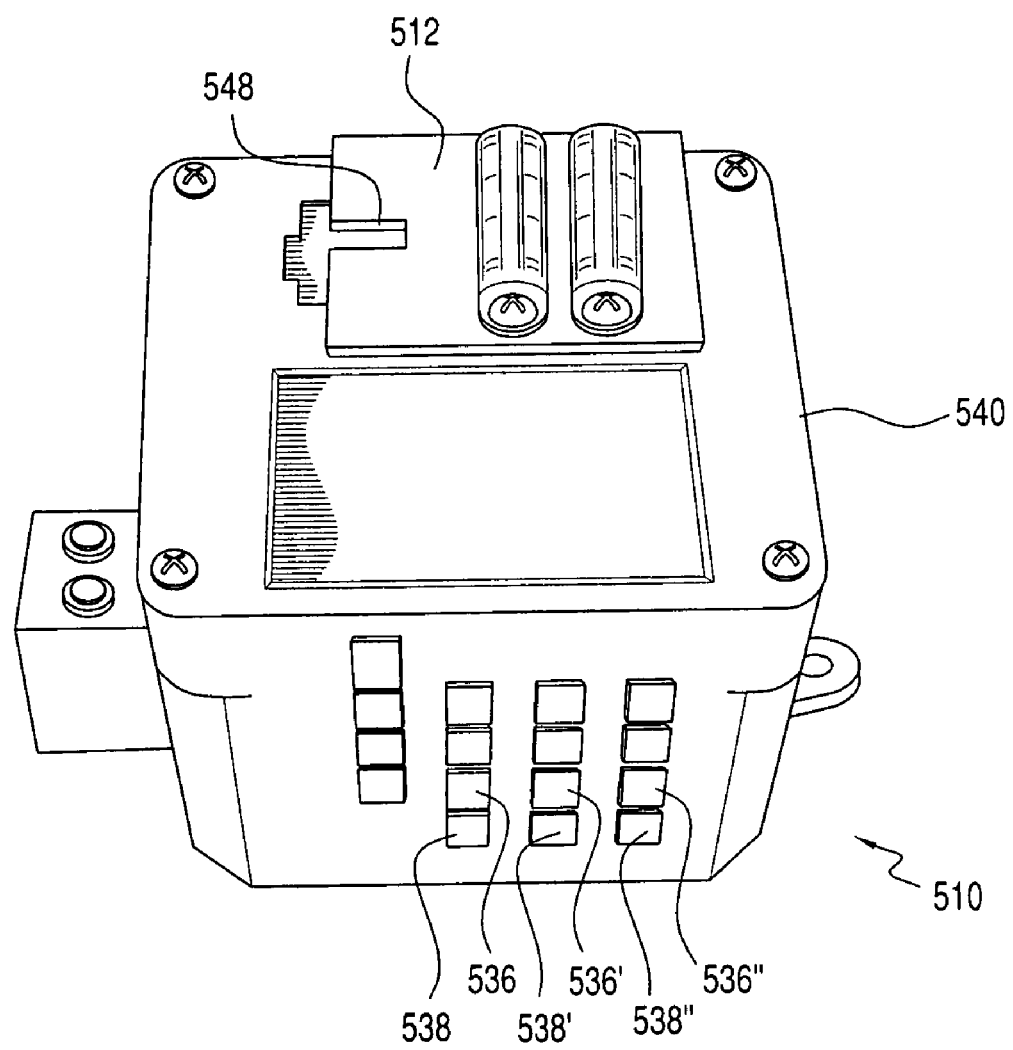
FIG. 19 is a perspective view of an override bypass switch in accordance with the present invention.

As shown in FIGS. 19 and 20, the casing 540 of the override/bypass switch 510 is provided with a series of labels 542, 544, 546 which coordinate with a slot 548 in the key connector 512 to indicate the operating condition of the relay 511. In particular, and as mentioned above, the labels indicate that the relay 511 is either operating in AUTO, NORMAL OR ENERGIZED modes.

Figure 21:
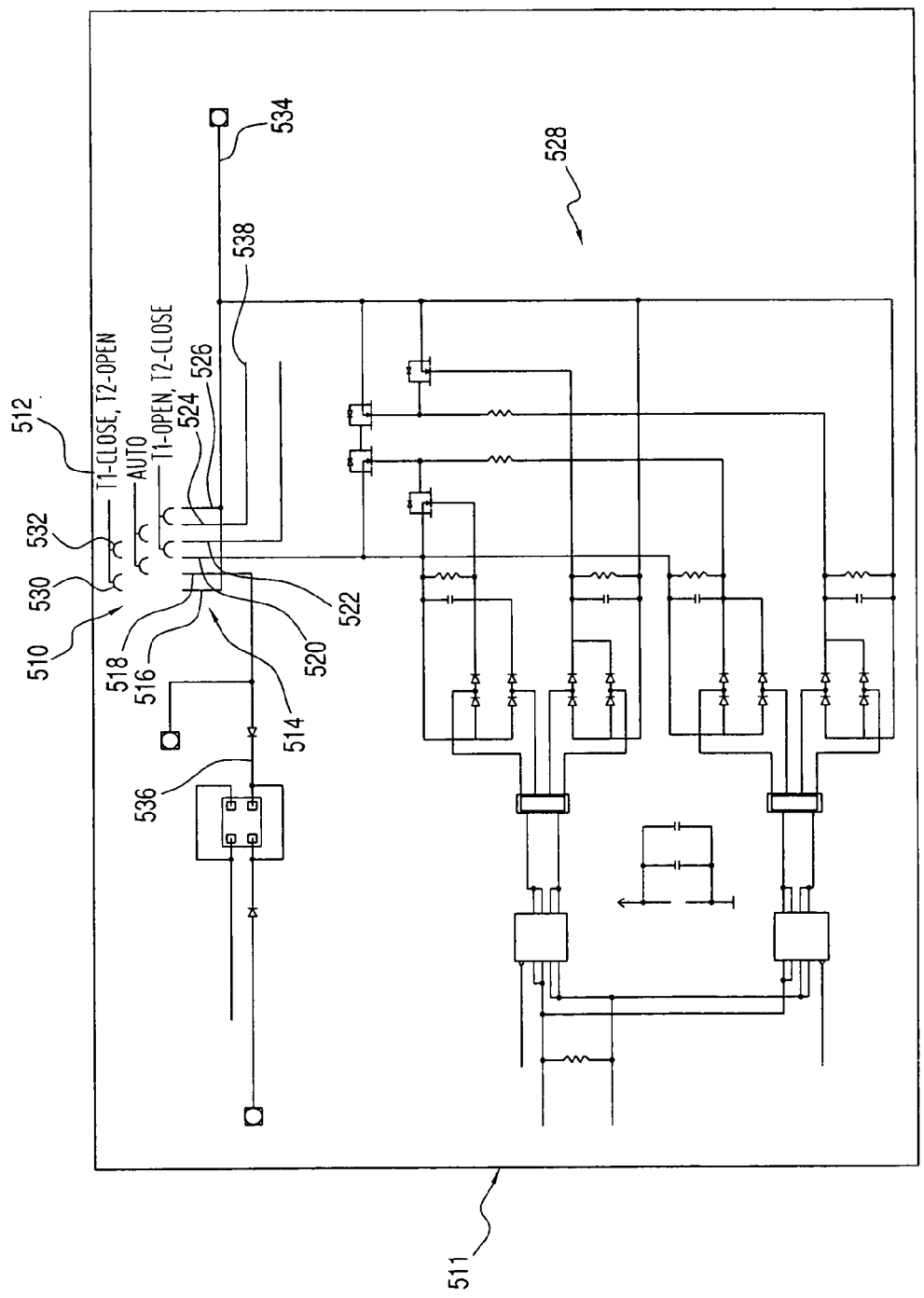
FIG. 21 is a schematic of the override/bypass switch circuitry.

With reference to the schematic shown in FIG. 21, the present override/bypass switch 510 is utilized in conjunction with a relay block 566 as described above. The relay block 566 is a normally closed relay block, although a normally open relay block may be utilized without departing from the spirit of the invention. The key connector 512 works by shorting the relay terminals 536, 538 to the relay block 566 (in AUTO mode) or by shorting the relay terminals 536, 538 to each other (in NORMAL or ENERGIZED). For instances, when one wishes the relay 511 to operate in it automatic mode, that is, as discussed above under the control of the control/sensing circuitry 18, the key connector 512 is positioned in a central position. This connects normally closed contact 518 to the first relay block contact 520 and the second relay block contact 522 to normally open contact 524 in a manner allowing the relay 511 to operate in a traditional manner under the control of the control/sensing circuitry 18. Where one wishes the switching circuit to operate in "normal" mode, that is, with the relay 566 locked for non-conducting, the normal closed contact 518 is shorted to the first common contact 516, the first relay block contact 520 is connected to the second relay block contact 522, and the normally open contact 524 is not connected. Similarly, where one wishes to operate in "energized" mode (with the relay locked for conducting), that is, with the relay 511 locked for conducting, the normally open contact 524 is shorted to the common contact 526, the first relay block contact 520 is connected to the second relay block contact 522, and the normally closed contact 518 is not connected.

Operation of the override/bypass in its various modes is shown in greater detail in FIGS. 22, 23, 24 and 25. These figures show the override/bypass switch 510 connected to a block diagram depicting a single pole double through relay block 566'. In accordance with a preferred embodiment of the present invention, one could consider the relay block 566' to be replaced with any of the relay blocks described above.

Figure 22:
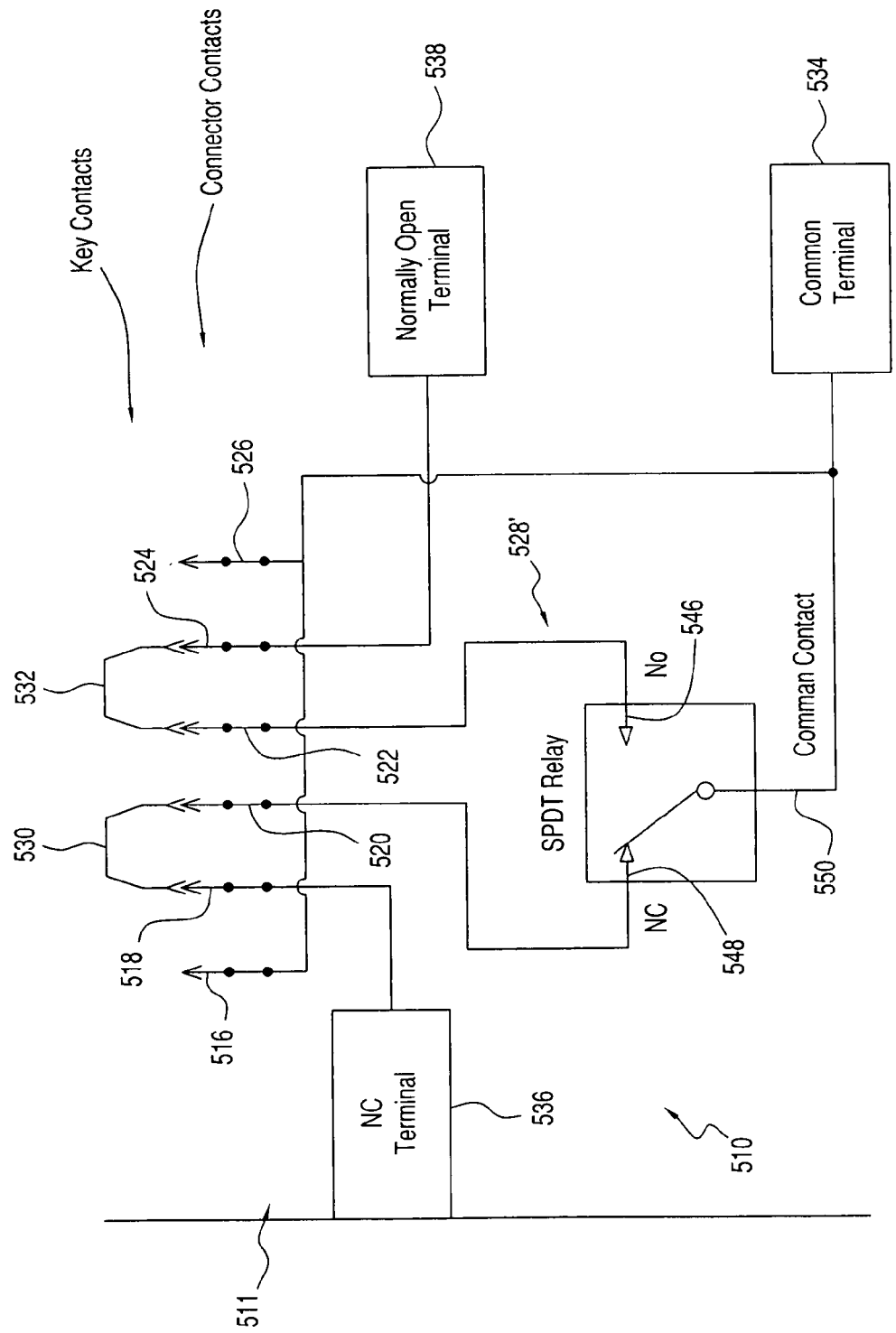
FIGS. 22–25 are schematics of different operational modes for the override/bypass switch.

Referring to FIG. 22, the override/bypass switch 510 is disclosed in its AUTO mode with the key connector 512 in its center position. In this configuration, the NC terminal 536 and the NO terminal 538 are respectively connected to the relay block 566', and the relay block 566' operates in the manner described above to control the flow of electricity between the NC terminal 536, the NO terminal 538 and the common terminal 534.

Figure 23:
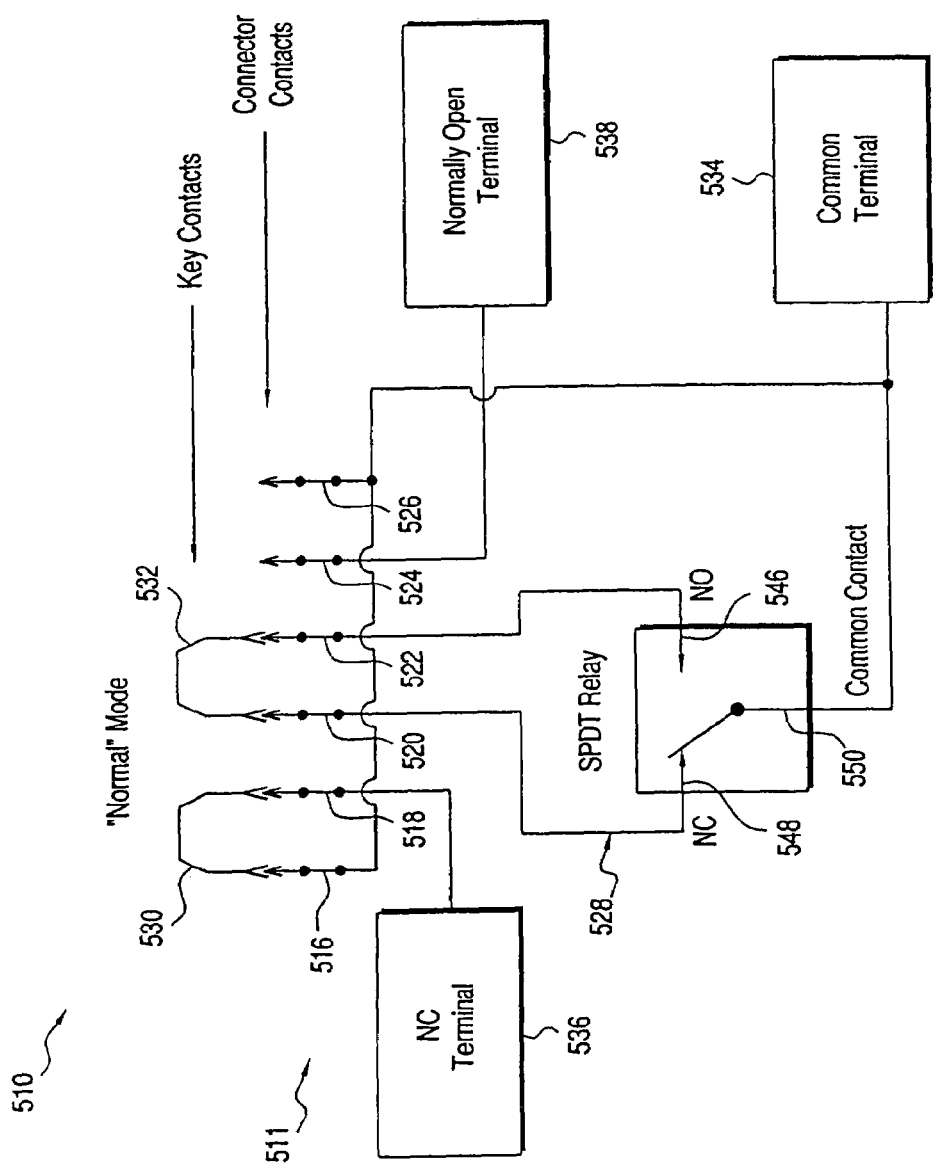

Referring to FIG. 23, the override/bypass switch 510 is in its NORMAL mode with the key connector 512 shifted to the left. In its NORMAL mode the key connector 512 shorts the connection between the NC terminal 536 and the common terminal 534. The NO terminal 538 is unconnected such that the relay 511 operates in its "normal" configuration, that is, it functions as if the open contact 546 of the relay block 566' is open and the closed contact 548 of the relay block 566' is closed with relation to the common contact 550.

Referring to FIG. 24, the override/bypass switch 510 is in its ENERGIZED mode with the key connector 512 shifted to the right. In its ENERGIZED mode the key connector 512 shorts the connection between the NO terminal 538 and the common terminal 534. The NC terminal 536 is unconnected such that the relay block 566' operates in its "energized" configuration, that is, it functions as if the closed contact 548 of the relay block 566' is open and the open contact 546 of the relay block 566' is closed with relation to the common contact 550.

Finally, and with reference to FIG. 25, the override/bypass switch 510 is in its safe mode with the key connector 512 fully removed from contact with the receptacle connector 514. In the safe mode all of the terminals of the relay 511 are safely disconnected. By simply removing the key connector 512, the system is shut down (power and load are removed) in case of an emergency or for maintenance. It should also be noted that the NC and NO contacts may be safely tested in this mode.

As shown in FIG. 20, the override/bypass switch 510 may be provided with a series of connections for simultaneously controlling the operation of multiple relays 511. As such, the override/bypass switch 510 further includes a second and third sets of contacts 516', 518', 520', 522', 524', 526', 516", 518", 520", 522", 524", 526" within the receptacle connector 514. The second and thirds sets of contacts 516', 518', 520', 522', 524', 526', 516", 518", 520", 522", 524", 526" each includes first and second common contacts 516', 516", 526', 526" connecting to a common terminal 534', 534", first and second relay block contacts 520', 520", 522', 522" connecting to the relay, a normally closed contact 518', 518" coupled to a normally closed terminal 536', 536" and a normally open contact 524', 524" coupled to a normally open terminal 538', 538". As with the first set of contacts described above, the key connector 512 is selectively positioned within the receptacle for contacting the second and third sets of contacts 516', 518', 520', 522', 524', 526', 516", 518", 520", 522", 524", 526" to place the relay in an automatic mode, a normal mode or an energized mode.

Although only three sets are shown, those skilled in the art will understand that more or less sets of the connectors may be provided for the key without departing from the spirit of the present invention.

While the preferred embodiments have been shown and described, it will be understood that there is no intent to limit the invention by such disclosure, but rather, it is intended to cover all modifications and alternate constructions falling within the spirit and scope of the invention as defined in the appended claims.

The invention claimed is:

1. A MOSFET based, high voltage, high current AC electronic relay operating with normally closed contacts, comprising:
    at least one power MOSFET switching circuit selectively switching between switch conducting and switch isolation, the power MOSFET switching circuit being normally closed and including a plurality of inputs controlling the operation thereof;
    a driving circuit being connected to the power MOSFET switching circuit via at least one rectifier coupled to the plurality of inputs such that a voltage differential exists between any two inputs of the power MOSFET switching circuit provide a voltage source maintaining the power MOSFET switching circuit normally closed;
    a control circuit linked to and controlling operation of the power MOSFET switching circuit; and
    a first transformer coupled to the power MOSFET switching circuit, the first transformer selectively applying a predetermined first voltage to the power MOSFET switching circuit which establishes the power MOSFET switching circuit in switch conducting; and a second transformer coupled to the power MOSFET switching circuit, the second transformer selectively applying a predetermined second voltage to the power MOSFET switching circuit which establishes the power MOSFET switching circuit in switch isolation in an expedited manner; and wherein the control circuit is linked to and controls the operation of the first and second transformers.

2. The electronic relay according to claim 1, wherein the first transformer is associated with a first rectifier and the second transformer is associated with a second rectifier.

3. The electronic relay according to claim 1, further including a power supply connected to the first transformer, the second transformer and the control circuit.

4. The electronic relay according to claim 1, wherein the power MOSFET switching circuit includes first and second power MOSFETs electrically connected to the first transformer for selectively establishing switch conducting upon application of a predetermined first voltage by the first transformer.

5. The electronic relay according to claim 4, wherein a first rectifier is associated with inputs of the first power MOSFET and a second rectifier is associated with inputs of the second power MOSFET.

6. The electronic relay according to claim 4, wherein the power MOSFET switching circuit includes third and fourth MOSFETs electrically connected to the second transformer for selectively establishing switch isolation upon the application of a predetermined second voltage by the second transformer.

7. The electronic relay according to claim 6, wherein a first rectifier is associated with inputs of the first power MOSFET, a second rectifier is associated with inputs of the second power MOSFET, a third rectifier is associated with inputs of the third MOSFET and a fourth rectifier is associated with inputs of the fourth MOSFET.

8. A MOSFET based, high voltage, high current AC electronic relay operating with normally closed contacts, comprising:
    at least one MOSFET switching circuit selectively switching between switch conducting and switch isolation, the MOSFET switching circuit being normally closed and including a plurality of inputs controlling the operation thereof;
    a first transformer including a primary winding connected to an AC driving circuit and a secondary winding, the secondary winding being coupled to the MOSFET switching circuit via a first rectifier coupled to the plurality of inputs such that a voltage differential exists between any two inputs of the MOSFET switching circuit provide a voltage source maintaining the MOSFET switching circuit normally closed, and wherein the first transformer selectively applies a predetermined first voltage to the MOSFET switching circuit which establishes the MOSFET switching circuit in switch conducting;
    a second transformer is coupled to the MOSFET switching circuit, the second transformer selectively applying a predetermined second voltage to the MOSFET switching circuit which establishes the MOSFET switching circuit in switch isolation in an expedited manner; and
    a control circuit linked to and controlling operation of the MOSFET switching circuit, the control circuit being further linked to and controlling operation of the first and second transformers.

9. The electronic relay according to claim 8, wherein the second transformer is associated with a second rectifier.

10. The electronic relay according to claim 8, wherein the MOSFET switching circuit includes first and second MOSFETs electrically connected to the first transformer for selectively establishing switch conducting upon application of a predetermined first voltage by the first transformer.

11. The electronic relay according to claim 10, wherein the first rectifier is associated with inputs of the first MOSFET and a second rectifier is associated with inputs of the second MOSFET.

12. The electronic relay according to claim 10, wherein the MOSFET switching circuit includes third and fourth MOSFETs electrically connected to the second transformer for selectively establishing switch isolation upon the application of a predetermined second voltage by the second transformer.

13. A MOSFET based, high voltage, high current AC electronic relay operating with normally closed contacts, comprising:

at least one MOSFET switching circuit selectively switching between switch conducting and switch isolation, the MOSFET switching circuit being normally closed and including a plurality of inputs controlling the operation thereof, the MOSFET switching circuit including a first MOSFET and a second MOSFETs;

a driving circuit coupled to the MOSFET switching circuit via a first rectifier coupled to the plurality of inputs such that a voltage differential exists between any two inputs of the MOSFET switching circuit provide a voltage source maintaining the MOSFET switching circuit normally closed;

a control circuit linked to and controlling operation of the MOSFET switching circuit; and a first transformer coupled to the MOSFET switching circuit, the first transformer selectively applying a predetermined first voltage to the MOSFET switching circuit which establishes the MOSFET switching circuit in switch conducting; and a second transformer coupled to the MOSFET switching circuit, the second transformer selectively applying a predetermined second voltage to the MOSFET switching circuit which establishes the MOSFET switching circuit in switch isolation in an expedited manner; and wherein the control circuit is linked to and controls the operation of the first and second transformers.

14. The electronic relay according to claim 13, wherein the first transformer is associated with the first rectifier and the second transformer is associated with a second rectifier.

15. The electronic relay according to claim 14, wherein the first and second MOSFETs are electrically connected to the first transformer for selectively establishing switch conducting upon application of a predetermined first voltage by the first transformer.

16. The electronic relay according to claim 15, wherein the first rectifier is associated with inputs of the first MOSFET and the second rectifier is associated with inputs of the second MOSFET.

17. The electronic relay according to claim 15, wherein the MOSFET switching circuit includes third and fourth MOSFETs electrically connected to the second transformer for selectively establishing switch isolation upon the application of a predetermined second voltage by the second transformer.

* * * * *

UNITED STATES PATENT AND TRADEMARK OFFICE
CERTIFICATE OF CORRECTION

PATENT NO. : 7,102,253 B2
APPLICATION NO. : 10/386665
DATED : September 5, 2006
INVENTOR(S) : James M. Lewis Page 1 of 1

It is certified that error appears in the above-identified patent and that said Letters Patent is hereby corrected as shown below:

In the Specification

Col. 1, line 13, insert the following:

-- This invention was made with government support under N65540-03-C-0025 awarded by the Department of Defense. The government has certain rights in the invention. --

Signed and Sealed this
Sixth Day of August, 2013

Teresa Stanek Rea
*Acting Director of the United States Patent and Trademark Office*